United States Patent
Rahul et al.

(10) Patent No.: US 11,088,678 B1
(45) Date of Patent: Aug. 10, 2021

(54) PULSED FLIP-FLOP CAPABLE OF BEING IMPLEMENTED ACROSS MULTIPLE VOLTAGE DOMAINS

(71) Applicant: XILINX, INC., San Jose, CA (US)

(72) Inventors: Kumar Rahul, Hyderabad (IN); Mohammad Anees, Hyderabad (IN); Mahendrakumar Gunasekaran, Coimbatore (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/788,262

(22) Filed: Feb. 11, 2020

(51) Int. Cl.
    *H03K 3/356*     (2006.01)
    *H03K 3/3562*     (2006.01)
    *H03K 19/0185*     (2006.01)
    *H03K 3/037*     (2006.01)
    *H03K 3/0233*     (2006.01)

(52) U.S. Cl.
CPC ....... *H03K 3/3562* (2013.01); *H03K 3/02332* (2013.01); *H03K 3/037* (2013.01); *H03K 3/0375* (2013.01); *H03K 19/018521* (2013.01)

(58) Field of Classification Search
CPC ............. H03K 3/0233; H03K 3/02332; H03K 3/02335; H03K 3/037; H03K 3/0372; H03K 3/0375; H03K 3/12; H03K 3/356; H03K 3/356017; H03K 3/356034; H03K 3/356104; H03K 3/35613; H03K 3/3562; H03K 3/35625; H03K 19/018521; H03K 19/018528
See application file for complete search history.

(56) References Cited

U.S. PATENT DOCUMENTS

| | | | |
|---|---|---|---|
| 6,717,448 B2* | 4/2004 | Heo | ................ H03K 3/356139 327/202 |
| 6,838,924 B1 | 1/2005 | Davies, Jr. | |
| 7,183,825 B2 | 2/2007 | Padhye et al. | |
| 7,368,946 B1 | 5/2008 | Rahman et al. | |
| 8,502,585 B2 | 8/2013 | Kuenemund et al. | |
| 8,766,701 B1 | 7/2014 | Sood | |
| 8,832,608 B1* | 9/2014 | Chakrabarty | ......... G06F 30/327 716/51 |
| 9,407,266 B2 | 8/2016 | Ho et al. | |
| 9,813,047 B2 | 11/2017 | Jayapal | |
| 2004/0135611 A1 | 7/2004 | Tohsche | |
| 2006/0145743 A1* | 7/2006 | Neubauer | .............. H03K 3/012 327/203 |
| 2007/0133314 A1 | 6/2007 | Chae | |
| 2011/0037508 A1 | 2/2011 | Lundberg | |
| 2014/0075087 A1 | 3/2014 | Bartling et al. | |
| 2014/0211893 A1 | 7/2014 | Rasouli et al. | |

* cited by examiner

*Primary Examiner* — Long Nguyen
(74) *Attorney, Agent, or Firm* — Patterson + Sheridan, LLP

(57) ABSTRACT

Examples described herein generally relate to devices that include a pulsed flip-flop capable of being implemented across multiple voltage domains. In an example, a device includes a pulsed flip-flop. The pulsed flip-flop includes a master circuit and a slave circuit sequentially connected to the master circuit. The master circuit includes a pre-charge input circuit and a first latch. A first node is connected between the pre-charge input circuit and the first latch. The slave circuit includes a resolving circuit and a second latch. The first node is connected to an input node of the resolving circuit. A second node is connected between the resolving circuit and the second latch. The resolving circuit is configured to selectively (i) pull up or pull down a voltage of the second node and (ii) be disabled.

20 Claims, 13 Drawing Sheets

US 11,088,678 B1

PULSED FLIP-FLOP CAPABLE OF BEING IMPLEMENTED ACROSS MULTIPLE VOLTAGE DOMAINS

TECHNICAL FIELD

Examples of the present disclosure generally relate to devices that include a pulsed flip-flop capable of being implemented across multiple voltage domains.

BACKGROUND

Integrated circuits (ICs) can have multiple voltage domains to operate different parts at different supply voltages. The use of multiple voltage domains can allow for efficient power management. To transmit signals across voltage domains, a level shifter circuit can be provided at the receiving circuit to shift the supply voltage of the transmitted signal to the voltage domain of the receiving circuit. Conventional level shifter circuits require supply voltages from both voltage domains in order to shift supply voltage of a signal from one domain to another. An added challenge can be incurred when the signal is to be synchronously transmitted. In such a situation, a clock signal can be provided at the receiving circuit, which can necessitate a supply voltage from the voltage domain of the clock circuit at the level shifter circuit. Conventional level shifter circuits in such implementations can have a high area consumption on the IC and can introduce an additional challenge of contention between different voltage domains.

SUMMARY

Examples described herein generally relate to devices that include a pulsed flip-flop capable of being implemented across multiple voltage domains. The pulsed flip-flop can have level shifting capabilities, among other possible benefits.

An example described herein is a device. The device includes a pulsed flip-flop. The pulsed flip-flop includes a master circuit and a slave circuit sequentially connected to the master circuit. The master circuit includes a pre-charge input circuit and a first latch. A first node is connected between the pre-charge input circuit and the first latch. The slave circuit includes a resolving circuit and a second latch. The first node is connected to an input node of the resolving circuit. A second node is connected between the resolving circuit and the second latch. The resolving circuit is configured to selectively (i) pull up or pull down a voltage of the second node and (ii) be disabled.

Another example described herein is a method of operating a device. A voltage of a first node of a first latch of a master circuit is pulled up by the master circuit of a pulsed flip-flop when a clock signal input to the pulsed flip-flop is in a first state. The voltage of the first node of the first latch is pulled down by the master circuit of the pulsed flip-flop when the clock signal is in a second state complementary to the first state and a data input signal input to the master circuit is in a third state. A state of the first node of the first latch is retained by the master circuit of the pulsed flip-flop when the clock signal is in the second state and the data input signal is in a fourth state complementary to the third state. A voltage of a second node of a second latch of a slave circuit is pulled up by the slave circuit of the pulsed flip-flop when the clock signal is in the second state and a signal on the first node is in a fifth state. The voltage of the second node of the second latch is pulled down by the slave circuit of the pulsed flip-flop when the clock signal is in the second state and the signal on the first node is in a sixth state complementary to the fifth state. A state of the second node of the second latch is retained by the slave circuit of the pulsed flip-flop when the clock signal is in the first state.

Another example described herein is a device. The device includes a first latching means, a pre-charging means, a second latching means, and a resolving means. The first latching means is for latching a state of a first node. The pre-charging means is for pulling up a voltage of the first node to a voltage of a first positive power supply node, pulling down the voltage of the first node to a voltage of a common negative power supply node, and de-coupling the first node from the first positive power supply node and the common negative power supply node through the pre-charging means based on a data input signal and a clock signal. The second latching means is for latching a state of a second node. The resolving means is for pulling up a voltage of the second node to a voltage of a second positive power supply node, pulling down the voltage of the second node to the voltage of the common negative power supply node, and being disabled based on the clock signal and the state of the first node of the first latching means.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
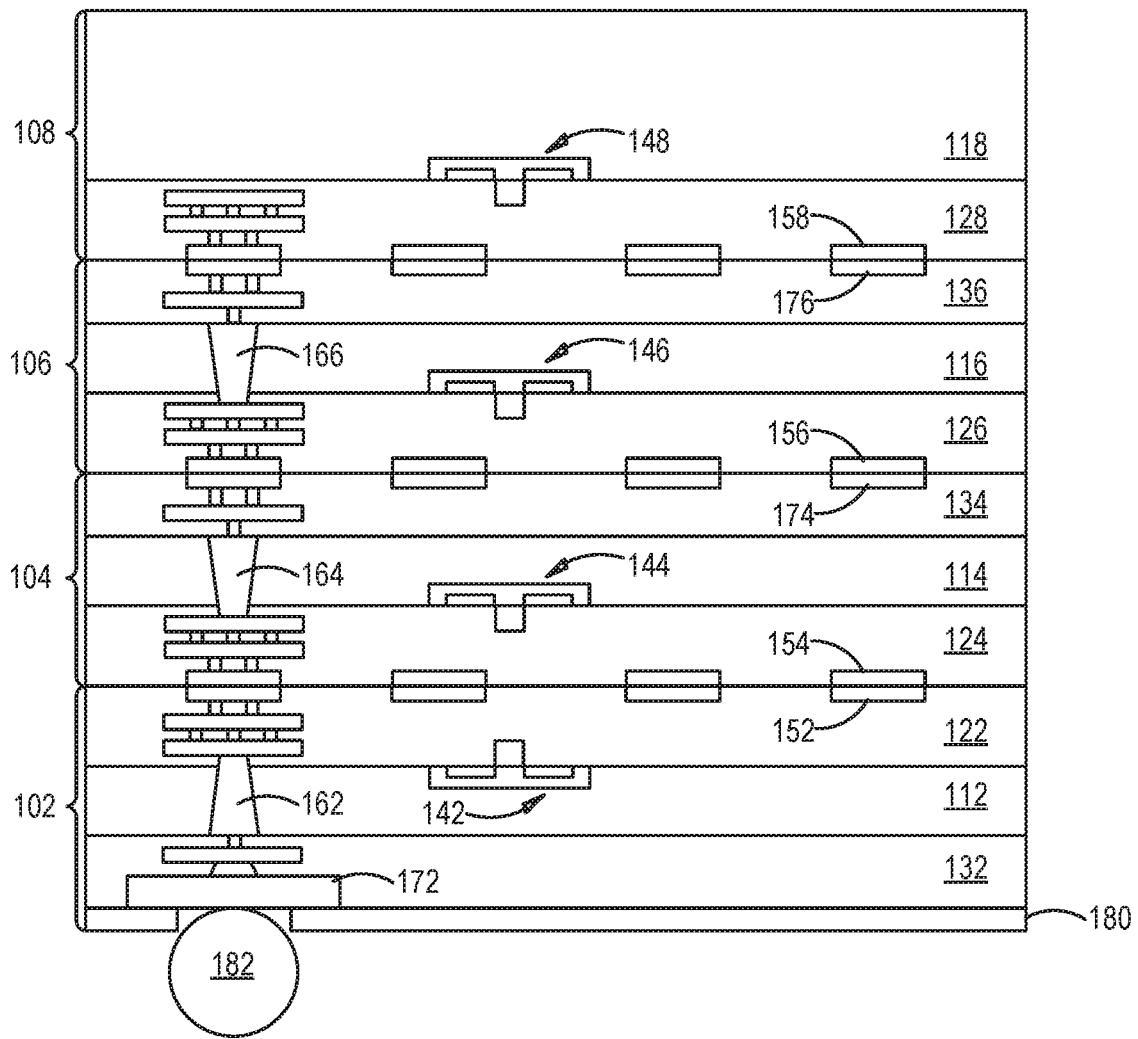
FIG. 1 is a structure of a multi-chip device according to some examples.

00191 Examples described herein generally relate to devices that include a pulsed flip-flop capable of being implemented across multiple voltage domains. The pulsed flip-flop has level shifting capabilities. The pulsed flip-flop can include a master circuit and a slave circuit sequentially connected to the master circuit. The master circuit can include a pre-charge input circuit and a first latch. The slave circuit can include a resolving circuit and a second latch.

The pre-charge input circuit and first latch are each connected between a first positive power supply node and a common negative power supply node. A data input node and a clock input node, on which a data input signal and a clock signal are input, are connected to respective input nodes of the pre-charge input circuit. The pre-charge input circuit is configured to pre-charge at least a first node of the first latch (e.g., pull up or pull down a voltage of at least the first node of the first latch) depending on respective states of the clock signal and/or data input signal. For example, the pre-charge input circuit can be configured to pull up a voltage of the first node of the first latch to a voltage of the first positive power supply node when the clock signal is in a state that is, e.g., logically low, and to pull down the voltage of the first node of the first latch to a voltage of the common negative power supply node when the clock signal is in a state that is, e.g., logically high and the data input signal is in a state that is, e.g., logically high. The pre-charge input circuit can also be configured to de-couple, through the pre-charge input circuit, the first node of the first latch from the first positive power supply node and the common negative power supply node when the clock signal is in a state that is, e.g., logically high and the data input signal is in a state that is, e.g., logically low. The first latch is configured to latch and retain the state of the first node of the first latch. The first latch can have a second node that is complementary of the first node of the first latch.

The resolving circuit and second latch are each connected between a second positive power supply node and the common negative power supply node. The first and second nodes of the first latch are connected to respective input nodes of the resolving circuit. The clock input node is further connected to an input node of the resolving circuit. The resolving circuit is configured to resolve a voltage on at least a first node of the second latch (e.g., pull up or pull down a voltage of at least the first node of the second latch) depending on respective states of the clock signal and/or signals on the first and second nodes of the first latch. The second latch can have a second node that is complementary of the first node of the second latch.

For example, the resolving circuit can be configured to pull down a voltage of the second node of the second latch to the voltage of the common negative power supply node when the clock signal is in a state that is, e.g., logically high and a signal on the first node of the first latch is in a state that is, e.g., logically high. Pulling down the voltage of the second node of the second latch causes a voltage of the first node of the second latch to be pulled up to a voltage of the second positive power supply node. The resolving circuit can further can be configured to pull down a voltage of the first node of the second latch to the voltage of the common negative power supply node when the clock signal is in a state that is, e.g., logically high and a signal on the second node of the first latch is in a state that is, e.g., logically high. Pulling down the voltage of the first node of the second latch causes a voltage of the second node of the second latch to be pulled up to the voltage of the second positive power supply node. The resolving circuit can also be configured to be disabled from pulling up or down voltages on the first and second nodes of the second latch when the clock signal is in a state that is, e.g., logically low. The second latch is configured to latch and retain the states of the first and second nodes of the second latch. Additionally, the slave circuit can be configured to de-couple the second latch from between the second positive power supply node and the common negative power supply node when the clock signal is in a state that is, e.g., logically high, which may coincide with the resolving circuit pulling up or down voltages of the first and second nodes of the second latch.

In some examples, the data input signal is in a first voltage domain different from a second voltage domain of the voltage of the second positive power supply node. In some examples, the clock signal and the voltage of the first positive power supply node are in a same third voltage domain. In various examples, the first, second, and third voltage domains can be different voltage domains, a same voltage domain, or any permutation of any two of the voltage domains being a same voltage domain while another is a different voltage domain.

Various examples can be implemented as level shifter circuits between voltage domains. Some examples can be robust in cases where variations between signals and voltage domains can be significant. Some examples can reduce latency and delay between propagation of a data input signal and a data output signal. Some examples can be implemented in a reduced area in an integrated circuit (IC) relative to previous circuits having similar functionality. Some examples can be robust across process, voltage, and temperature (PVT). Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a structure of a multi-chip device according to some examples. The multi-chip device of FIG. 1 includes a chip stack that includes a base chip 102, intermediate chips 104, 106, and a distal chip 108. The base chip 102, intermediate chips 104, 106, and distal chip 108 are described herein as examples. Although the different chips are described herein as being or including various integrated circuits (ICs) or components (e.g., input/output, fabric, programmable logic, compute, etc.), aspects described herein can be generally applicable to chips of a multi-chip device having any type of IC or component.

In the multi-chip device of FIG. 1, the intermediate chips 104, 106 and distal chip 108 are arranged active or front side facing down towards the base chip 102, where the base chip 102 is arranged active or front side facing up towards the intermediate chips 104, 106 and distal chip 108. In other multi-chip devices, the intermediate chips 104, 106 are arranged active or front side facing up away from the base chip 102, and the distal chip 108 is arranged active or front side facing down towards the base chip 102, where the base chip 102 is arranged active or front side facing up towards the intermediate chips 104, 106 and distal chip 108.

Generally, the chips 102-108 are stacked and form a chip stack in the multi-chip device. The chips 102-108 are stacked to form, in some examples, an Active die-on-Active die (AoA) device. Each of the chips 102-108 can include an active IC. In some examples, more or fewer chips can be included in the chip stack. For example, a multi-chip device can have two chips (such as a base chip and a distal chip), can have three chips (such as a base chip, an intermediate chip, and a distal chip), or can have four or more chips (such as a base chip, two or more intermediate chips, and a distal chip). In some examples, a multi-chip device can have three chips, four chips, five chips, etc.

Each of the chips 102-108 includes a respective semiconductor substrate 112, 114, 116, 118 and respective front side dielectric layer(s) 122, 124, 126, 128 on a front side of the respective semiconductor substrate 112-118. The front side dielectric layer(s) 122-128 include metallization (e.g., metal lines and/or vias) (illustrated but not specifically numbered) formed therein which can electrically connect various components in an IC. Each of the chips 102-106 includes respective backside dielectric layer(s) 132, 134, 136 on a backside of the respective semiconductor substrate 112-116. The backside dielectric layer(s) 132-136 include metallization (e.g., metal lines and/or vias) (illustrated but not specifically numbered) formed therein which can electrically connect various components in an IC. Each semiconductor substrate 112-118 of the chips 102-108 includes, e.g., a transistor 142, 144, 146, 148 formed on and/or in the front side surface of the respective semiconductor substrate 112-118. The transistor 142-148 and any other components can be connected to the metallization in the front side dielectric layer(s) 122-128. Each semiconductor substrate 112-116 of the respective chip 102-106 has backside through-substrate via(s) (TSV(s)) 162, 164, 166 therethrough, which can electrically connect the metallization in the front side dielectric layer(s) 122-126 to the metallization in the backside dielectric layer(s) 132-136 of the respective chip 102-106.

Front side bond pads 152, 154, 156, 158 (e.g., metal (e.g., Cu) bond pads) are formed in the respective front side dielectric layer(s) 122-128 of the chips 102-108 at an exterior surface distal from the respective semiconductor substrate 112-118. The front side bond pads 152-158 can be in an arrangement that forms a respective chip-to-chip interface. The front side bond pads 152-158 are connected to the metallization in the respective front side dielectric layer(s) 122-128. Backside bond pads 174, 176 (e.g., metal (e.g., Cu) bond pads) are formed in the respective backside dielectric layer(s) 134, 136 of the intermediate chips 104, 106 at an exterior surface distal from the respective semiconductor substrate 114, 116. The backside bond pads 174, 176 can be in an arrangement that forms a respective chip-to-chip interface. The backside bond pads 174, 176 are connected to the metallization in the respective backside dielectric layer(s) 134, 136.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102-108 are bonded (e.g., by hybrid bonding using metal-to-metal and oxide-to-oxide bonding) together to form a chip stack. The base chip 102 is bonded to the intermediate chip 104 front side to front side such that the front side bond pads 152 and exterior surface of the front side dielectric layer(s) 122 of the base chip 102 are bonded to the front side bond pads 154 and exterior surface of the front side dielectric layer(s) 124 of the intermediate chip 104. The intermediate chip 104 is bonded to the intermediate chip 106 backside to front side such that the backside bond pads 174 and exterior surface of the backside dielectric layer(s) 134 of the intermediate chip 104 are bonded to the front side bond pads 156 and exterior surface of the front side dielectric layer(s) 126 of the intermediate chip 106. The intermediate chip 106 is bonded to the distal chip 108 backside to front side such that the backside bond pads 176 and exterior surface of the backside dielectric layer(s) 136 of the intermediate chip 106 are bonded to the front side bond pads 158 and exterior surface of the front side dielectric layer(s) 128 of the distal chip 108.

Other arrangements of bonding can be implemented. For example, the base chip 102 can be bonded to the intermediate chip 104 front side to backside such that the front side bond pads 152 and exterior surface of the front side dielectric layer(s) 122 of the base chip 102 are bonded to the backside bond pads 174 and exterior surface of the backside dielectric layer(s) 134 of the intermediate chip 104. The intermediate chip 104 can be bonded to the intermediate chip 106 front side to backside such that the front side bond pads 154 and exterior surface of the front side dielectric layer(s) 124 of the intermediate chip 104 are bonded to the backside bond pads 176 and exterior surface of the backside dielectric layer(s) 136 of the intermediate chip 106. The intermediate chip 106 can be bonded to the distal chip 108 front side to front side such that the front side bond pads 156 and exterior surface of the front side dielectric layer(s) 126 of the intermediate chip 106 are bonded to the front side bond pads 158 and exterior surface of the front side dielectric layer(s) 128 of the distal chip 108.

In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

In some examples, the base chip 102 includes an interconnect that is capable of transmitting signals generally horizontally (e.g., parallel to the front side surface of the semiconductor substrate 112). The interconnect can be electrically and communicatively coupled to the other chips of the chip stack. Signals can be transmitted in the interconnect of the base chip 102 and then vertically (through metallizations and TSVs of various chips) to an appropriate target chip in the chip stack. Additionally, the base chip 102 includes appropriate input/output circuits for receiving signals from a source and/or transmitting signals to a destination outside of the chip stack of the multi-chip device. The base chip 102 can further include other circuits. For example, the base chip 102 can be or include a processing IC and may further be a System-on-Chip (SoC). A more detailed example is described below.

In some examples, each of the intermediate chips 104, 106 and distal chip 108 includes a processing IC. A processing IC can generally include any circuit configured to or configurable to process any data and/or signal and output data and/or a signal resulting from that processing, and is more than merely memory and any circuit ancillary to memory (e.g., address decoder, memory controller, etc.). The processing IC of the intermediate chips 104, 106 can be a same IC in some examples. The hardware topology, architecture, and layout of the intermediate chips 104, 106 can be the same in some examples. In some examples, the processing IC of the intermediate chips 104, 106 includes one or more programmable logic regions (e.g., fabric of a FPGA), which has the same hardware topology, architecture, and layout between the intermediate chips 104, 106. In other examples, the intermediate chips 104, 106 are different ICs.

The distal chip 108 can be or include any IC. For example, the distal chip 108 can be or include a processing IC or memory. In some examples, the distal chip 108 is an ASIC. In some examples, the distal chip 108 is a same processing IC as one or both of the intermediate chips 104, 106 except without, e.g., TSVs and backside dielectric layer(s) and metallizations therein. In other examples, the intermediate chips 104, 106 and distal chips 108 can each be a different IC. Any intermediate chip 104, 106 or distal chip 108 may generically be referred to as an active chip.

Figure 2:
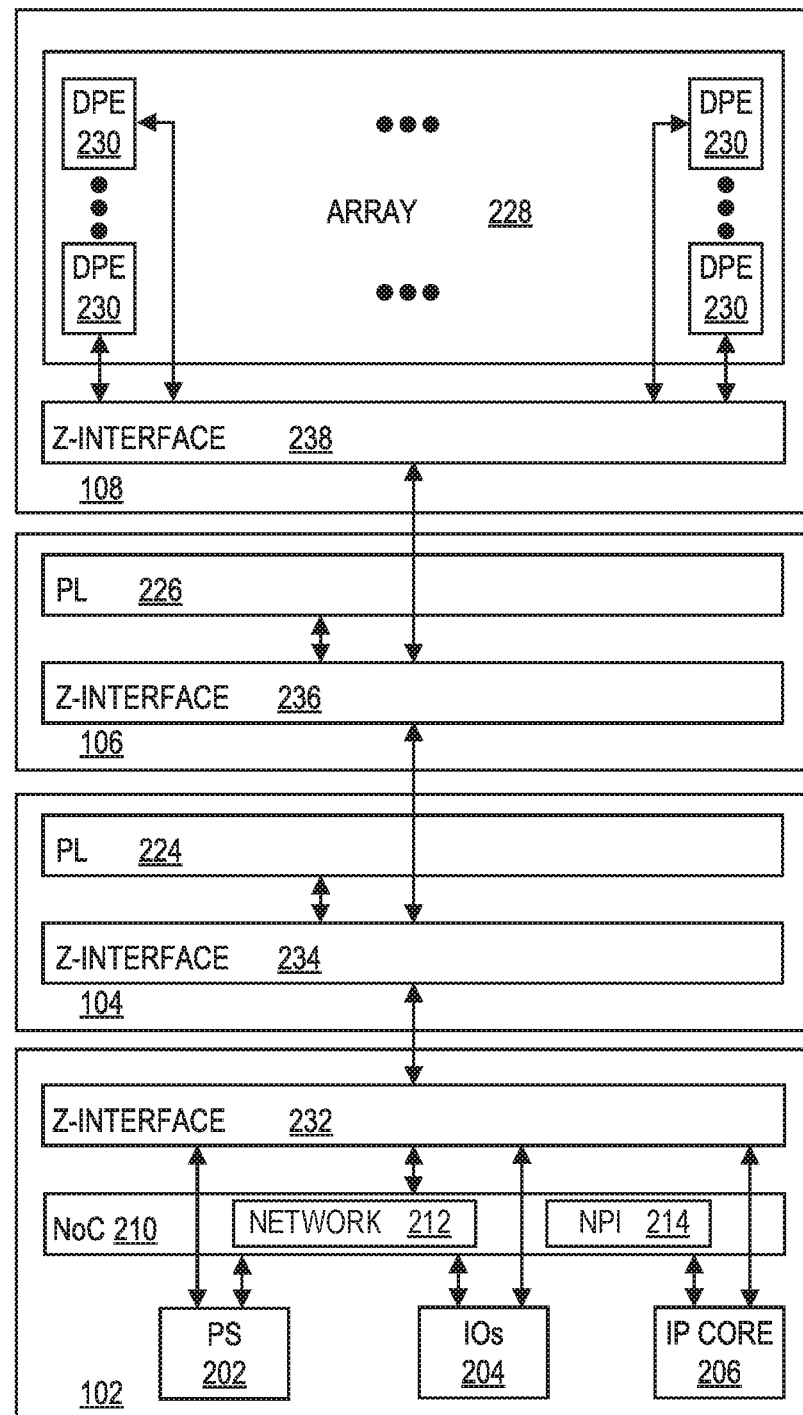
FIG. 2 is a block diagram of a circuit schematic depicting integrated circuits of a chip stack of the multi-chip device of FIG. 1 according to some examples.

FIG. 2 is a block diagram of a circuit schematic depicting ICs of a chip stack of the multi-chip device of FIG. 1 according to some examples. In the illustrated example, the multi-chip device is a multi-chip programmable device. The circuit schematic can be implemented in the multi-chip device of FIG. 1, e.g., regardless of the orientation of the intermediate chips 104, 106.

In the illustrated example, the base chip 102 includes a base IC on the base chip 102, which may be a SoC. The intermediate chips 104, 106 include a respective fabric IC. The distal chip 108 includes a compute IC. These ICs are provided as an example implementation. Other ICs (e.g., with other hard IP blocks) can be implemented in the chips.

The base IC on the base chip 102 includes a processing system 202, input/output circuits (IOs) 204, IP core circuits 206, a Network-on-Chip (NoC) 210, and a Z-interface 232. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that connects a master circuit to the programmable network 212, and each NSU is an egress circuit that connects the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches connected to the NPI root node, and protocol blocks connected to the interconnected NPI switches and a corresponding register block. The NPI 214 may be used to program any programmable circuit of the base IC on the base chip 102. For example, the NPI 214 may be used to program any input/output circuit 204 and/or IP core circuit 206 that is programmable.

The Z-interface 232 can include active circuits, such as buffers to drive signals. The Z-interface 232 provides an interface, including through metal lines and vias in metallization layers, for the processing system 202, input/output circuits 204, IP core circuits 206, and programmable network 212 of the NoC 210 to chips overlying the base chip 102 and/or a substrate (e.g., package substrate) underlying the base chip 102. Additionally, the Z-interface 232 can provide a pass-through interface through the base chip 102. The Z-interface 232 can include pulsed flip-flops as described herein, which may level shift received signals into another voltage domain.

The various subsystems and circuits of the base IC on the base chip 102 can be communicatively coupled. As illustrated, the processing system 202, input/output circuits 204, and IP core circuits 206 are connected to the NoC 210 (e.g., to the programmable network 212), and hence, are communicatively coupled to each other. The processing system 202 is further connected to the NPI 214 for communicating configuration data to various programmable components on the base chip 102. The processing system 202 is further connected to the programmable network 212 of the NoC 210 for communicating configuration data to chips overlying the base chip 102. The programmable network 212 of the NoC 210 is connected to the Z-interface 232 such that data, such as transactional data and configuration data, can be communicated through the Z-interface 232 to another chip. Each of the processing system 202, input/output circuits 204, and IP core circuits 206 is connected to the Z-interface 232 for communications with, e.g., programmable logic in the fabric ICs in overlying intermediate chips 104, 106. Other communication mechanisms, such as direct connections, between the various subsystems and circuits may be implemented.

The fabric IC on each of the intermediate chips 104, 106 includes a programmable logic (PL) region 224, 226, respectively, and a Z-interface 234, 236, respectively. The PL region 224, 226 is logic circuitry that may be programmed to perform specified functions. The PL region 224, 226 can include any number or arrangement of programmable tiles. As an example, PL region 224, 226 may be implemented as fabric of an FPGA. For example, the PL region 224, 226 can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associate programmable interconnect elements can be connected to neighboring programmable logic elements in a same column and row, for example. The programmable interconnect element can form an interconnect network of the PL region 224, 226. Any logic and connections can be implemented by the PL region 224, 226 by programming or configuring any of the programmable tiles of the PL region 224, 226.

The Z-interface 234, 236 on each of the intermediate chips 104, 106 can include active circuits, such as buffers to drive signals. The Z-interface 234, 236 provides an interface, including through metal lines and vias in metallization layers, for the respective PL region 224, 226 to communicate with chips overlying and/or underlying the respective intermediate chip 104, 106. Additionally, the Z-interface 234, 236 can provide a pass-through interface through the respective intermediate chip 104, 106. Configuration data for the PL regions 224, 226 can be transmitted through connections through Z-interfaces 234, 236, for example. The Z-interfaces 234, 236 can include pulsed flip-flops as described herein, which may level shift received signals into another voltage domain.

Each PL region 224, 226 can also include a configuration interconnect that includes a configuration Frame (CFRAME) driver. The CFRAME driver may be or include control logic to communicate configuration data (such as a bitstream) to configure programmable logic. Each PL region 224, 226 is configurable or programmable by configuration data received via the Z-interface 232, a corresponding Z-interface 234, 236 of the respective intermediate chip 104, 106, and any intervening Z-interface 234. For example, the processing system 202 (e.g., a PMC of the processing system 202) can transmit configuration data via the programmable network 212 of the NoC 210 and the Z-interface 232 to a respective PL region 224, 226. In some examples, a configuration interconnect (e.g., including a CFRAME driver) can direct the configuration data to appropriate programmable tiles and can control configuring such programmable tiles.

The compute IC on the distal chip 108 includes a data processing engine (DPE) array 228 and a Z-interface 238. The DPE array 228 includes DPEs 230 arranged in an array.

The Z-interface 238 can include active circuits, such as buffers to drive signals. The Z-interface 238 provides an interface, including through metal lines and vias in metallization layers, for each of the DPEs 230 to communicate with chips underlying the distal chip 108. Each of the DPEs 230 is connected to the Z-interface 238. Hence, the DPEs 230 can be connected to various systems of other chips via the Z-interface 238. The Z-interface 238 provides an interface between DPEs 230 and other subsystems, such as the PL regions 224, 226 of the intermediate chips 104, 106 and/or the programmable network 212 of the NoC 210. Configuration data for the DPEs 230 can be transmitted through connections through the Z-interface 238, for example. The Z-interface 238 can include pulsed flip-flops as described herein, which may level shift received signals into another voltage domain.

Each of the DPEs 230 is a hardwired circuit block and may be programmable. Each of the DPEs 230 includes a hardened core and a memory module. The core provides data processing capabilities of the DPE 230. The core may be implemented as any of a variety of different processing circuits. In some examples, the core is implemented as a processor that is capable of executing program instruction code, e.g., computer readable program instruction code. Program memory can be included in the core and can be capable of storing program instruction code that is executed by the core. The memory module includes memory banks. The memory banks are capable of storing data that may be read and consumed by one or more core and data (e.g., results) that may be written by one or more core. The memory module can further include a direct memory access (DMA) engine for direct memory accesses to the memory banks.

Each of the DPEs 230 further includes a streaming switch and a memory mapped switch. The streaming switch is connected to the core and memory module (e.g., a DMA engine in a memory module) of the respective DPE 230. The streaming switch of a DPE 230 is connected to streaming switches in neighboring DPEs 230. The interconnected streaming switches of the DPEs 230 form a streaming network. The memory mapped switch of a DPE 230 is connected to memory mapped switch(es) of neighboring DPE(s) 230 along a given direction. The interconnected memory mapped switches of the DPEs 230 form a memory mapped network. Each of the DPEs 230 can also include configuration registers, which can be programmed to configure the core, memory module (e.g., programmable components therein), streaming switch, or any other programmable component of the respective DPE 230. The memory mapped switch can be coupled to the configuration registers for writing to or programming the configuration registers. In some examples, the streaming network and the memory mapped network can each be implemented as an on-chip interconnect, such as an Advanced Microcontroller Bus Architecture (AMBA) eXtensible Interface (AXI) bus (e.g., or switch) and/or other interconnect circuitry.

In some examples, the DPEs 230 are mapped to the address space of the processing system 202. Accordingly, any configuration registers and/or memories within any DPE 230 may be accessed via the memory mapped network. For example, the program memory, the memory banks, and configuration registers of a DPE 230 may be read and/or written via the memory mapped network (e.g., via the memory mapped switch of the respective DPE 230). Through the memory mapped network, subsystems of the multi-chip device are capable of reading or writing any configuration register, program memory, and memory bank.

DPEs 230 may be programmed by loading configuration data into respective configuration registers that define operations of the DPEs 230 (including cores, memory modules, and streaming switches), by loading program instruction code into program memory for execution by the core of the respective DPEs 230, and/or by loading application data into memory banks of the DPEs 230. The processing system 202 (e.g., a PMC of the processing system 202) can transmit configuration data, program instruction code, and/or application data via the programmable network 212 of the NoC 210 and the Z-interfaces 232-238 to one or more DPEs 230. The configuration data, program instruction code, and/or application data received from the programmable network 212 is a memory mapped transaction that is routed via the memory mapped network to a configuration register, program memory, and/or memory bank addressed by the memory mapped transaction (and hence, to a target DPE 230). The configuration data, program instruction code, and/or application data is written to the configuration register, program memory, and/or memory bank, respectively, by the memory mapped transaction.

Once the streaming network (e.g., streaming switches) is configured, cores of DPEs 230 can communicate with each other or with other subsystems via the streaming network. A core of a DPE 230 can write or read data to or from a memory module (e.g., a DMA engine) of another DPE 230 by streaming communications via the streaming network. The streaming network can route the streaming communications according to the configuration of various streaming switches as programmed in respective configuration registers.

Cores in neighboring DPEs 230 can further communicate via shared memory communications. A core of a DPE 230 can be directly connected to respective memory modules of neighboring DPEs 230. A core of a DPE 230 can directly write to a memory bank, and a core of a neighboring DPE 230 can directly read from that memory bank, which permits communication between the cores. The memory bank can therefore be shared between the cores of neighboring DPEs 230. An independent cascade stream can also be implemented between cores of DPEs 230.

FIGS. 1 and 2 have been provided to illustrate some examples in which a pulsed flip-flop may be implemented. When signals are propagated vertically between chips in a chip stack, the signals can incur a voltage drop due to the inherent resistance of the metal lines, vias, and/or TSVs on which the respective signal is propagated. The voltage drop between different chips can be different. For example, a voltage drop that a signal incurs when propagated from the base chip 102 to the distal chip 108 usually will be greater than the voltage drop that a signal incurs when propagated from the base chip 102 to the intermediate chip 104. Generally, a greater vertical propagation distance between chips results in a greater voltage drop (e.g., due to a greater resistance from a longer propagation route). Additionally, power distribution through the chip stack with similar voltage drops can also cause positive power supply nodes in the chips to be in different voltage domains. Accordingly, signals in the different chips can be in different voltage domains. A pulsed flip-flop, as described below, can be implemented in a chip that receives a signal and at a boundary between different voltage domains.

Although FIGS. 1 and 2 have been provided as an example, in other examples, a pulsed flip-flop can be implemented in a single-chip device. The single chip can implement, for example, a number of voltage domains for power management. The pulsed flip-flop can be implemented at a boundary between different voltage domains for signals to be passed through the boundary. As an example, a pulsed flip-flop can be implemented in an input multiplexer (IMUX) structure at a boundary of a programmable logic region of an IC (e.g., at a boundary of fabric of an FPGA). In such an example, the pulsed flip-flop can level shift a signal to a voltage domain of the programmable logic region from a voltage domain of a transmitting circuit.

Figure 3:
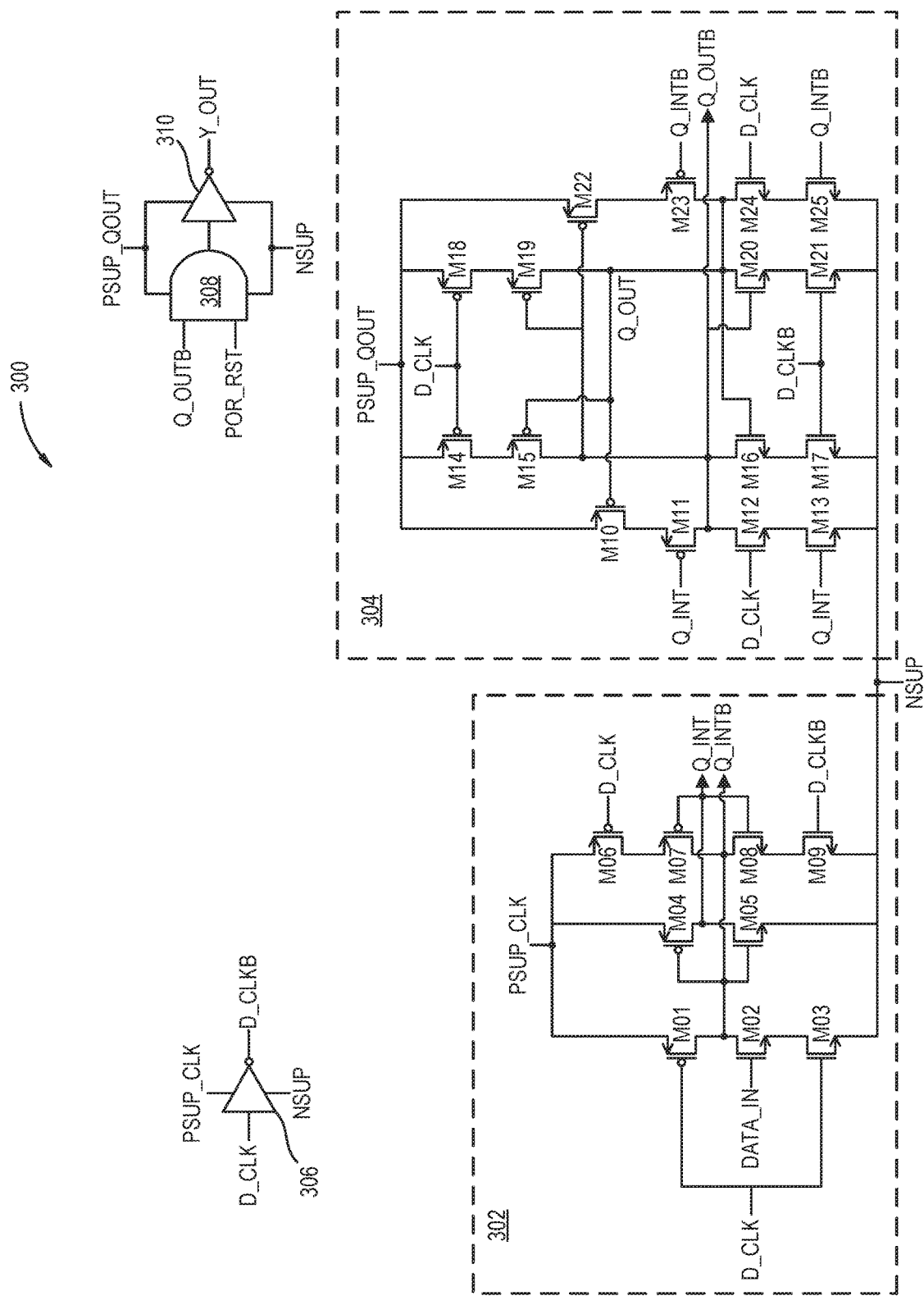
FIG. 3 is a circuit schematic of a pulsed flip-flop according to some examples.

FIG. 3 is a circuit schematic of a pulsed flip-flop 300 according to some examples. The pulsed flip-flop 300 can be implemented in any of the Z-interfaces 232-238 of FIG. 2, for example. In other examples, the pulsed flip-flop 300 can be implemented in any IC. The pulsed flip-flop 300 can be implemented in any instance where a signal is to cross voltage domains. In the discussion of the circuit of FIG. 3 or any other circuit herein, a particular node and a signal on that particular node may have a same reference indicator. A person having ordinary skill in the art will readily understand when the reference indicator refers to the node or the signal based on the context of the description.

The pulsed flip-flop 300 includes a master circuit 302 and a slave circuit 304. The pulsed flip-flop 300 has input nodes, including data input node DATA_IN, clock input node D_CLK, clock voltage domain positive power supply node PSUP_CLK, output voltage domain positive power supply node PSUP_QOUT, common negative power supply node NSUP, and power-on-reset node POR_RST, and has one or more output nodes, including flip-flop output node Y_OUT.

The pulsed flip-flop 300 also includes an inverter 306. An input node of the inverter 306 is connected to the clock input node D_CLK, and an output node of the inverter 306 is connected to a complementary clock node D_CLKB, which is a node internal to the pulsed flip-flop 300. The inverter 306 is connected between the clock voltage domain positive power supply node PSUP_CLK and the common negative power supply node NSUP for power. The inverter 306 receives a clock input signal D_CLK on the clock input node D_CLK and inverts the clock input signal D_CLK to a complementary clock signal D_CLKB that is output on the complementary clock node D_CLKB.

The master circuit 302 includes p-type transistors M01, M04, M06, M07, and n-type transistors M02, M03, M05, M08, M09. The p-type transistor M01 and n-type transistors M02, M03 are connected together to form a pre-charge input circuit. At least the p-type transistors M04, M07, and n-type transistors M05, M08 are connected together to form a latch.

Respective sources of the p-type transistors M01, M04, M06 are connected to the clock voltage domain positive power supply node PSUP_CLK. Respective drains of the p-type transistor M01 and the n-type transistor M02 are connected together at a complementary internal node Q_INTB. A source of the n-type transistor M02 is connected to a drain of the n-type transistor M03. A source of the n-type transistor M03 is connected to the common negative power supply node NSUP. Respective gates of the p-type transistor M01 and n-type transistor M03 are connected to the clock input node D_CLK, and a gate of the n-type transistor M02 is connected to the data input node DATA_IN.

Drains of the p-type transistor M04 and the n-type transistor M05 are connected together at an internal node Q_INT. A source of the n-type transistor M05 is connected to the common negative power supply node NSUP. A drain of the p-type transistor M06 is connected to a source of the p-type transistor M07. Respective drains of the p-type transistor M07 and the n-type transistor M08 are connected together at the complementary internal node Q_INTB. A source of the n-type transistor M08 is connected to a drain of the n-type transistor M09. A source of the n-type transistor M09 is connected to the common negative power supply node NSUP. A gate of the p-type transistor M06 is connected to the clock input node D_CLK, and a gate of the n-type transistor M09 is connected to the complementary clock node D_CLKB.

Respective gates of the p-type transistor M04 and n-type transistor M05 are connected together at the complementary internal node Q_INTB. Hence, the drains of the p-type transistors M01, M07 and n-type transistors M02, M08 and the gates of the p-type transistor M04 and n-type transistor M05 are connected together at the complementary internal node Q_INTB. Respective gates of the p-type transistor M07 and n-type transistor M08 are connected together at the internal node Q_INT. Hence, the drains of the p-type transistor M04 and n-type transistor M05 and the gates of the p-type transistor M07 and n-type transistor M08 are connected together at the internal node Q_INT. As is apparent, the internal node Q_INT and the complementary internal node Q_INTB are configured to be complementary of each other (e.g., the respective signals on the internal node Q_INT and the complementary internal node Q_INTB are complementary).

The slave circuit 304 includes p-type transistors M10, M11, M14, M15, M18, M19, M22, M23, and n-type transistors M12, M13, M16, M17, M20, M21, M24, M25. The p-type transistors M10, M11, M22, M23, and n-type transistors M12, M13, M24, M25 are connected together to form a resolving circuit. At least the p-type transistors M15, M19 and n-type transistors M16, M20 are connected together to form a latch. The latch can also be considered a feedback circuit to the resolving circuit (e.g., through p-type transistors M10, M22).

Respective sources of the p-type transistors M10, M14, M18, M22 are connected to the output voltage domain positive power supply node PSUP_QOUT. A drain of the p-type transistor M10 is connected to a source of the p-type transistor M11. Respective drains of the p-type transistor M11 and n-type transistor M12 are connected together at a slave complementary output node Q_OUTB. A source of the n-type transistor M12 is connected to a drain of the n-type transistor M13. A source of the n-type transistor M13 is connected to the common negative power supply node NSUP. Respective gates of the p-type transistor M11 and n-type transistor M13 are connected to the internal node Q_INT. A gate of the n-type transistor M12 is connected to the clock input node D_CLK.

A drain of the p-type transistor M14 is connected to a source of the p-type transistor M15. Respective drains of the p-type transistor M15 and n-type transistor M16 are connected together at the slave complementary output node Q_OUTB. A source of the n-type transistor M16 is connected to a drain of the n-type transistor M17. A source of the n-type transistor M17 is connected to the common negative power supply node NSUP. A drain of the p-type transistor M18 is connected to a source of the p-type transistor M19. Respective drains of the p-type transistor M19 and n-type transistor M20 are connected together at a slave output node Q_OUT. A source of the n-type transistor M20 is connected to a drain of the n-type transistor M21. A source of the n-type transistor M21 is connected to the common negative power supply node NSUP. Respective gates of the p-type transistors M14, M18 are connected to the clock input node D_CLK. Respective gates of the n-type transistors M17, M21 are connected to the complementary clock node D_CLKB.

A drain of the p-type transistor M22 is connected to a source of the p-type transistor M23. Respective drains of the p-type transistor M23 and n-type transistor M24 are connected together at the slave output node Q_OUT. A source of the n-type transistor M24 is connected to a drain of the n-type transistor M25. A source of the n-type transistor M25 is connected to the common negative power supply node NSUP. Respective gates of the p-type transistor M23 and n-type transistor M25 are connected to the complementary internal node Q_INTB. A gate of the n-type transistor M24 is connected to the clock input node D_CLK.

Respective gates of the p-type transistors M10, M15 and n-type transistor M16 are connected together at the slave output node Q_OUT. Hence, the drains of the p-type transistors M19, M23 and n-type transistors M20, M24 and the gates of the p-type transistors M10, M15 and n-type transistor M16 are connected together at the slave output node Q_OUT. Respective gates of the p-type transistors M19, M22 and n-type transistor M20 are connected together at the slave complementary output node Q_OUTB. Hence, the drains of the p-type transistors M11, M15 and n-type transistors M12, M16 and the gates of the p-type transistors M19, M22 and n-type transistor M20 are connected together at the slave complementary output node Q_OUTB. As is apparent, the slave output node Q_OUT and the slave complementary output node Q_OUTB are configured to be complementary of each other (e.g., the respective signals on the slave output node Q_OUT and the slave complementary output node Q_OUTB are complementary).

Generally, the pre-charge input circuit of the master circuit 302 is configured to pull up a voltage of the complementary internal node Q_INTB to a voltage of the clock voltage domain positive power supply node PSUP_CLK, to pull down the voltage of the complementary internal node Q_INTB to a voltage of the common negative power supply node NSUP, and to de-couple, through the pre-charge input circuit, the complementary internal node Q_INTB from the clock voltage domain positive power supply node PSUP_CLK and common negative power supply node NSUP based on the clock input signal D_CLK on the clock input node D_CLK and/or the data input signal DATA_IN on the data input node DATA_IN. Generally, the latch of the master circuit 302 is configured to retain a state of the complementary internal signal Q_INTB on the complementary internal node Q_INTB (and further, a state of an internal signal Q_INT on the internal node Q_INT), which may be pre-charged by the pre-charge input circuit.

When the clock input signal D_CLK on the clock input node D_CLK is logically low, the pre-charge input circuit pulls up the voltage of the complementary internal node Q_INTB to the voltage of the clock voltage domain positive power supply node PSUP_CLK. When the clock input signal D_CLK on the clock input node D_CLK is logically low, the p-type transistor M01 is closed, and the n-type transistor M03 is open. The p-type transistor M01 being closed while the n-type transistor M03 is open pulls up the voltage of the complementary internal node Q_INTB to logically high. The latch drives the internal signal Q_INT on the internal node Q_INT to logically low and the complementary internal signal Q_INTB on the complementary internal node Q_INTB to logically high as a result of the voltage of the complementary internal node Q_INTB being pulled up.

When the clock input signal D_CLK on the clock input node D_CLK is logically high, the pre-charge input circuit pulls down the voltage of the complementary internal node Q_INTB to the voltage of the common negative power supply node NSUP or de-couples, through the pre-charge input circuit, the complementary internal node Q_INTB from the clock voltage domain positive power supply node PSUP_CLK and common negative power supply node NSUP based on the data input signal DATA_IN on the data input node DATA_IN. De-coupling the complementary internal node Q_INTB from the clock voltage domain positive power supply node PSUP_CLK and common negative power supply node NSUP causes the complementary internal signal Q_INTB on the complementary internal node Q_INTB to retain its state in the latch. When the clock input signal D_CLK on the clock input node D_CLK is logically high, the p-type transistor M01 is open, and the n-type transistor M03 is closed. If the data input signal DATA_IN on the data input node DATA_IN is logically high, the n-type transistor M02 is closed. While the n-type transistors M02, M03 are closed and the p-type transistor M01 is open, the voltage of the complementary internal node Q_INTB is pulled down to logically low. The latch drives the internal signal Q_INT on the internal node Q_INT to logically high and the complementary internal signal Q_INTB on the complementary internal node Q_INTB to logically low as a result of the voltage of the complementary internal node Q_INTB being pulled down. If the data input signal DATA_IN on the data input node DATA_IN is logically low, the n-type transistor M02 is open. While the p-type transistor M01 and the n-type transistor M02 are open, the latch retains its state such that the complementary internal signal Q_INTB on the complementary internal node Q_INTB and the internal signal Q_INT on the internal node Q_INT retain their respective states.

As described be the foregoing, the pre-charge input circuit is configured to pull up the voltage of the complementary internal node Q_INTB when the clock input signal D_CLK is logically low, to pull down the voltage of the complementary internal node Q_INTB when the clock input signal D_CLK and the data input signal DATA_IN are logically high, and to de-couple the complementary internal node Q_INTB from the clock voltage domain positive power supply node PSUP_CLK and the common negative power supply node NSUP when the clock input signal D_CLK is logically high and the data input signal DATA_IN is logically low. When the clock input signal D_CLK is logically high and the data input signal DATA_IN is logically low, the latch retains its state.

Additionally, when the clock input signal D_CLK is logically high, the p-type transistor M06 and n-type transistor M09 can be open, which can de-couple an inverter of the latch (that includes the p-type transistor M07 and n-type transistor M08) from the clock voltage domain positive power supply node PSUP_CLK and the common negative power supply node NSUP. This can reduce power consumption when, e.g., the latch is to retain its state and/or the voltage of the complementary internal node Q_INTB is being pulled down.

Generally, the resolving circuit of the slave circuit 304 is configured to pull up a voltage of the slave complementary output node Q_OUTB to a voltage of the output voltage domain positive power supply node PSUP_QOUT, to pull down the voltage of the slave complementary output node Q_OUTB to a voltage of the common negative power supply node NSUP, and to be disabled based on the clock input signal D_CLK on the clock input node D_CLK and/or one or both of the complementary internal signal Q_INTB on the complementary internal node Q_INTB and the internal signal Q_INT on the internal node Q_INT. Generally, the latch of the slave circuit 304 is configured to retain a state of the slave complementary output signal Q_OUTB on the slave complementary output node Q_OUTB (and further, a state of an slave output signal Q_OUT on the slave output node Q_OUT), which may be resolved by the resolving circuit. Further, the slave circuit 304 can be configured to de-couple the latch from between the output voltage domain positive power supply node PSUP_QOUT and the common negative power supply node NSUP when the resolving circuit is pulling up or pulling down the voltage of the slave complementary output node Q_OUTB, and can be configured to couple the latch to the output voltage domain positive power supply node PSUP_QOUT and the common negative power supply node NSUP when the resolving circuit is disabled.

In the illustrated example, the latch is de-coupled from the output voltage domain positive power supply node PSUP_QOUT and the common negative power supply node NSUP when the clock input signal D_CLK on the clock input node D_CLK is logically high and, hence, the complementary clock signal D_CLKB on the complementary clock node D_CLKB is logically low. The clock input signal D_CLK being logically high and the complementary clock signal D_CLKB being logically low causes the p-type transistors M14, M18 and n-type transistors M17, M21 to be open, which de-couples the latch from the output voltage domain positive power supply node PSUP_QOUT and the common negative power supply node NSUP. Conversely, the clock input signal D_CLK being logically low and the complementary clock signal D_CLKB being logically high causes the p-type transistors M14, M18 and n-type transistors M17, M21 to be closed, which couples the latch to the output voltage domain positive power supply node PSUP_QOUT and the common negative power supply node NSUP.

When the clock input signal D_CLK on the clock input node D_CLK is logically high, the resolving circuit pulls up or down a voltage of the slave complementary output node Q_OUTB to a voltage of the output voltage domain positive power supply node PSUP_QOUT or common negative power supply node NSUP, respectively, based on the complementary internal signal Q_INTB and internal signal Q_INT on the complementary internal node Q_INTB and internal node Q_INT, respectively. When the clock input signal D_CLK and the internal signal Q_INT are logically high, the n-type transistors M12, M13 are closed, which pulls down the voltage of the slave complementary output node Q_OUTB to the voltage of the common negative power supply node NSUP, which can be logically low. Pulling down the voltage of the slave complementary output node Q_OUTB can cause the p-type transistor M22 to close, and the p-type transistor M23 is closed due to the complementary internal signal Q_INTB being logically low. The n-type transistor M25 is open due to the complementary internal signal Q_INTB being logically low. With the p-type transistors M22, M23 being closed and the n-type transistor M25 being open, the voltage of the slave output node Q_OUT is pulled up to the voltage of the output voltage domain positive power supply node PSUP_QOUT, which can be logically high.

When the clock input signal D_CLK and the complementary internal signal Q_INTB are logically high, the n-type transistors M24, M25 are closed, which pulls down the voltage of the slave output node Q_OUT to the voltage of the common negative power supply node NSUP, which can be logically low. Pulling down the voltage of the slave output node Q_OUT can cause the p-type transistor M10 to close, and the p-type transistor M11 is closed due to the internal signal Q_INT being logically low. The n-type transistor M13 is open due to the internal signal Q_INT being logically low. With the p-type transistors M10, M11 being closed and the n-type transistor M13 being open, the voltage of the slave complementary output node Q_OUTB is pulled up to the voltage of the output voltage domain positive power supply node PSUP_QOUT, which can be logically high.

When the clock input signal D_CLK on the clock input node D_CLK is logically low, the resolving circuit is disabled. Based on the complementary nature of the internal signal Q_INT and the complementary internal signal Q_INTB, one of the n-type transistors M13, M25 will generally be closed at any given time while the other is open. The clock input signal D_CLK being low causes at least the n-type transistor M12, M24 that is connected in series with the closed one of the n-type transistors M13, M25 to be open. Hence, at least one transistor in the series connection of the n-type transistors M12, M13 and at least one transistor in the series connection of the n-type transistors M24, M25 will be open. These transistors being open prevents the resolving circuit from pulling down the voltage of the slave output node Q_OUT and the slave complementary output node Q_OUTB, which disables the resolving circuit.

For example, when the clock input signal D_CLK and the internal signal Q_INT are logically low, at least the n-type transistors M13, M24 are open, which prevents the slave complementary output node Q_OUTB and the slave output node Q_OUT from being pulled down. When the clock input signal D_CLK and the complementary internal signal Q_INTB are logically low, at least the n-type transistors M12, M25 are open, which prevents the slave complementary output node Q_OUTB and the slave output node Q_OUT from being pulled down. When the clock input signal D_CLK on the clock input node D_CLK is logically low, the latch retains the state of the slave complementary output signal Q_OUTB on the slave complementary output node Q_OUTB and the slave output signal Q_OUT on the slave output node Q_OUT.

The pulsed flip-flop 300 further includes an AND gate 308 and an inverter 310. The slave complementary output node Q_OUTB and the power-on-reset node POR_RST are connected to respective input nodes of the AND gate 308. An output node of the AND gate 308 is connected to an input node of the inverter 310. An output node of the inverter 310 is the flip-flop output node Y_OUT of the pulsed flip-flop 300. The AND gate 308 can enable or disable the flip-flop output signal Y_OUT on the flip-flop output node Y_OUT based on a power-on-reset signal POR_RST on the power-on-reset node POR_RST. The power-on-reset signal POR_RST can be a signal that is determined based on the voltage levels of one or more voltage domains and can cause the flip-flop output signal Y_OUT on the flip-flop output node Y_OUT to be disabled during a power up and a power down sequence. The inverter 310 can have a high drivability, such as two times the drivability of the inverter 306.

The slave complementary output signal Q_OUTB on the slave complementary output node Q_OUTB is ANDed at the AND gate 308 with a power-on-reset signal POR_RST on the power-on-reset node POR_RST, and the signal resulting from the AND is inverted by the inverter 310 and output as a flip-flop output signal Y_OUT on the flip-flop output node Y_OUT. Another logical operation (e.g., an equivalent logical operation) can be performed instead of and/or in addition to the AND gate 308 and inverter 310.

FIGS. 4 through 7 show example waveforms of the clock input signal D_CLK and the data input signal DATA_IN and the resulting flip-flop output signal Y_OUT to illustrate some operations of the pulsed flip-flop 300 of FIG. 3. In FIGS. 4 through 7, at time T1, the slave complementary output signal Q_OUTB and power-on-reset signal POR_RST are logically high such that the flip-flop output signal Y_OUT is logically low. Further, the power-on-reset signal POR_RST remains logically high throughout the time illustrated in FIGS. 4 through 7.

Figure 4:
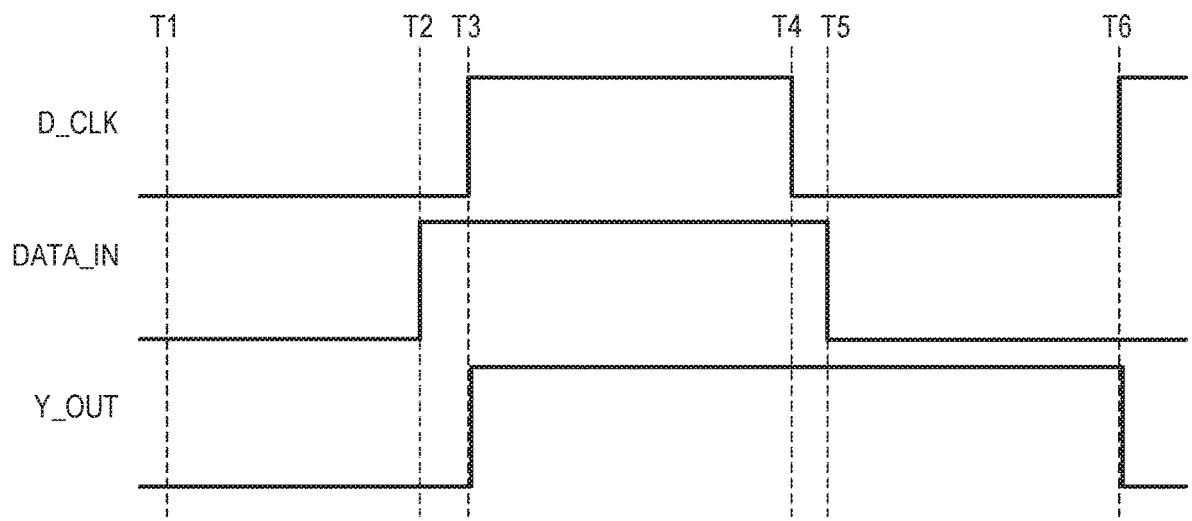
FIGS. 4 through 7 show example waveforms of a clock input signal and a data input signal and the resulting flip-flop output signal to illustrate some operations of the pulsed flip-flop of FIG. 3.

Referring to FIG. 4, at time T1, the clock input signal D_CLK is logically low. This causes the pre-charge input circuit of the master circuit 302 to pull up the voltage of the complementary internal node Q_INTB to logically high, which causes the latch of the master circuit 302 to pull down the voltage of the internal node Q_INT to logically low. Further, the resolving circuit of the slave circuit 304 is disabled and is prevented from pulling down the voltages of the slave complementary output node Q_OUTB and the slave output node Q_OUT to logically low, and the latch of the slave circuit 304 retains the state of the slave complementary output signal Q_OUTB as logically high. The slave complementary output signal Q_OUTB being logically high causes the flip-flop output signal Y_OUT to be logically low.

At time T2, the data input signal DATA_IN transitions from logically low to logically high. The clock input signal D_CLK remains logically low, which causes the pulsed flip-flop 300 to retain its states from time T1.

At time T3, the clock input signal D_CLK transitions from logically low to logically high while the data input signal DATA_IN remains logically high. With the clock input signal D_CLK and data input signal DATA_IN both logically high, the pre-charge input circuit of the master circuit 302 pulls down the voltage of the complementary internal node Q_INTB to logically low, which causes the internal signal Q_INT to be pulled up to logically high by the latch of the master circuit 302. With the clock input signal D_CLK logically high, the latch of the slave circuit 304 is de-coupled from the output voltage domain positive power supply node PSUP_QOUT and the common negative power supply node NSUP. With the clock input signal D_CLK and internal signal Q_INT both logically high, the resolving circuit of the slave circuit 304 pulls down the voltage of the slave complementary output signal Q_OUTB to logically low. The slave complementary output signal Q_OUTB being logically low causes the flip-flop output signal Y_OUT to be logically high. FIG. 4 illustrates that some latency may occur between the transition of the clock input signal D_CLK at time T3 to the resulting transition (e.g., rising edge) of flip-flop output signal Y_OUT.

At time T4, the clock input signal D_CLK transitions from logically high to logically low. The clock input signal D_CLK being logically low causes the pre-charge input circuit of the master circuit 302 to pull up the voltage of the complementary internal node Q_INTB to logically high, which causes the latch of the master circuit 302 to pull down the internal signal Q_INT to logically low. Further, the resolving circuit of the slave circuit 304 is disabled and is prevented from pulling down the voltage of the slave complementary output node Q_OUTB and the slave output node Q_OUT to logically low. The latch of the slave circuit 304 retains the state of the slave complementary output signal Q_OUTB as logically low. The slave complementary output signal Q_OUTB being logically low causes the flip-flop output signal Y_OUT to be logically high.

At time T5, the data input signal DATA_IN transitions from logically high to logically low. The clock input signal D_CLK remains logically low, which causes the pulsed flip-flop 300 to retain its states from time T1.

At time T6, the clock input signal D_CLK transitions from logically low to logically high while the data input signal DATA_IN remains logically low. With the clock input signal D_CLK logically high and the data input signal DATA_IN logically low, the pre-charge input circuit of the master circuit 302 de-couples, through the pre-charge input circuit, the complementary internal node Q_INTB from the clock voltage domain positive power supply node PSUP_CLK and the common negative power supply node NSUP. The latch of the master circuit 302 retains its state from time T5 where the complementary internal signal Q_INTB is logically high and the internal signal Q_INT is logically low. With the clock input signal D_CLK logically high, the latch of the slave circuit 304 is de-coupled from the output voltage domain positive power supply node PSUP_QOUT and the common negative power supply node NSUP. With the clock input signal D_CLK and complementary internal signal Q_INTB both logically high, the resolving circuit of the slave circuit 304 pulls down the voltage of the slave output node Q_OUT to logically low, which causes the voltage of the slave complementary output node Q_OUTB to be pulled up to logically high. The slave complementary output signal Q_OUTB being logically high causes the flip-flop output signal Y_OUT to be logically low.

Figure 5:
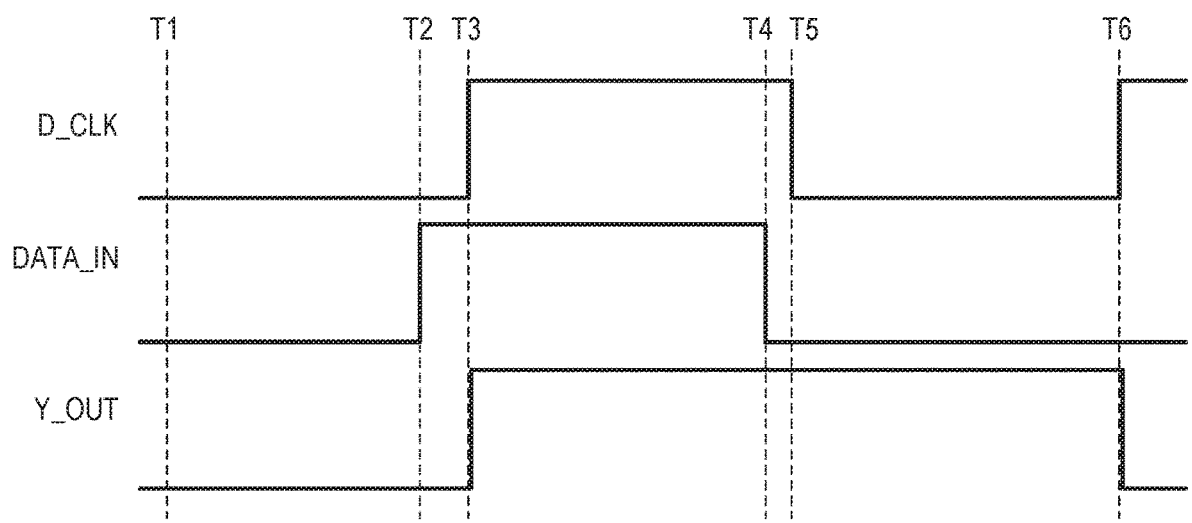

The waveform of the data input signal DATA_IN of FIG. 5 differs from the waveform of the data input signal DATA_IN of FIG. 4 in that the transition of the data input signal DATA_IN from logically high to logically low (e.g., a falling edge) occurs before, rather than after, the transition of the clock input signal D_CLK from logically high to logically low at time T4 in FIG. 4. The operations and states of times T1, T2, T3, T6 of FIG. 4 are the same as the operations and states of times T1, T2, T3, T6 of FIG. 5.

At time T4, the data input signal DATA_IN transitions from logically high to logically low while the clock input signal D_CLK remains logically high. With the clock input signal D_CLK logically high and the data input signal DATA_IN logically low, the pre-charge input circuit of the master circuit 302 de-couples, through the pre-charge input circuit, the complementary internal node Q_INTB from the clock voltage domain positive power supply node PSUP_CLK and the common negative power supply node NSUP. The latch of the master circuit 302 retains its state from time T5 where the complementary internal signal Q_INTB is logically low and the internal signal Q_INT is logically high. With the clock input signal D_CLK logically high, the latch of the slave circuit 304 is de-coupled from the output voltage domain positive power supply node PSUP_QOUT and the common negative power supply node NSUP. With the clock input signal D_CLK and internal signal Q_INT both logically high, the resolving circuit of the slave circuit 304 pulls down the voltage of the slave complementary output node Q_OUTB to logically low. The slave complementary output signal Q_OUTB being logically low causes the flip-flop output signal Y_OUT to be logically high.

At time T5, the clock input signal D_CLK transitions from logically high to logically low. The clock input signal D_CLK being logically low causes the pre-charge input circuit of the master circuit 302 to pull up the voltage of the complementary internal node Q_INTB to logically high, which causes the latch of the master circuit 302 to pull down the voltage of the internal node Q_INT to logically low. Further, the resolving circuit of the slave circuit 304 is disabled and is prevented from pulling down the voltages of the slave complementary output node Q_OUTB and the slave output node Q_OUT to logically low. The latch of the slave circuit 304 retains the state of the slave complementary output signal Q_OUTB as logically low. The slave complementary output signal Q_OUTB being logically low causes the flip-flop output signal Y_OUT to be logically high.

Figure 6:
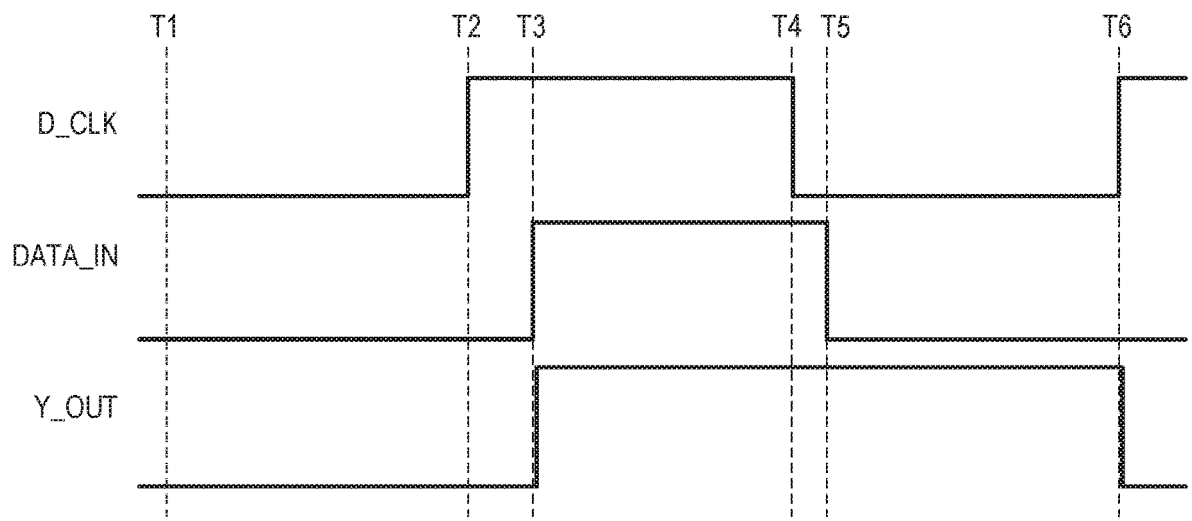

The waveform of the data input signal DATA_IN of FIG. 6 differs from the waveform of the data input signal DATA_IN of FIG. 4 in that the transition of the data input signal DATA_IN from logically low to logically high (e.g., a rising edge) occurs after, rather than before, the transition of the clock input signal D_CLK from logically low to logically high at time T3 in FIG. 4. The operations and states of times T1, T4, T5, T6 of FIG. 4 are the same as the operations and states of times T1, T4, T5, T6 of FIG. 6.

At time T2, the clock input signal D_CLK transitions from logically low to logically high while the data input signal DATA_IN remains logically low. With the clock input signal D_CLK logically high and the data input signal DATA_IN logically low, the pre-charge input circuit of the master circuit 302 de-couples, through the pre-charge input circuit, the complementary internal signal Q_INTB from the clock voltage domain positive power supply node PSUP_CLK and the common negative power supply node NSUP. The latch of the master circuit 302 retains its state from time T1 where the complementary internal signal Q_INTB is logically high and the internal signal Q_INT is logically low. With the clock input signal D_CLK logically high, the latch of the slave circuit 304 is de-coupled from the output voltage domain positive power supply node PSUP_QOUT and the common negative power supply node NSUP. With the clock input signal D_CLK and complementary internal signal Q_INTB both logically high, the resolving circuit of the slave circuit 304 pulls down the voltage of the slave output node Q_OUT to logically low, which causes the voltage of the slave complementary output node Q_OUTB to be pulled up to logically high. The slave complementary output signal Q_OUTB being logically high causes the flip-flop output signal Y_OUT to be logically low.

At time T3, the data input signal DATA_IN transitions from logically low to logically high while the clock input signal D_CLK remains logically high. With the clock input signal D_CLK and data input signal DATA_IN both logically high, the pre-charge input circuit of the master circuit 302 pulls down the voltage of the complementary internal node Q_INTB to logically low, which causes the internal signal Q_INT to be pulled up to logically high by the latch of the master circuit 302. With the clock input signal D_CLK logically high, the latch of the slave circuit 304 is de-coupled from the output voltage domain positive power supply node PSUP_QOUT and the common negative power supply node NSUP. With the clock input signal D_CLK and internal signal Q_INT both logically high, the resolving circuit of the slave circuit 304 pulls down the voltage of the slave complementary output node Q_OUTB to logically low. The slave complementary output signal Q_OUTB being logically low causes the flip-flop output signal Y_OUT to be logically high.

Figure 7:
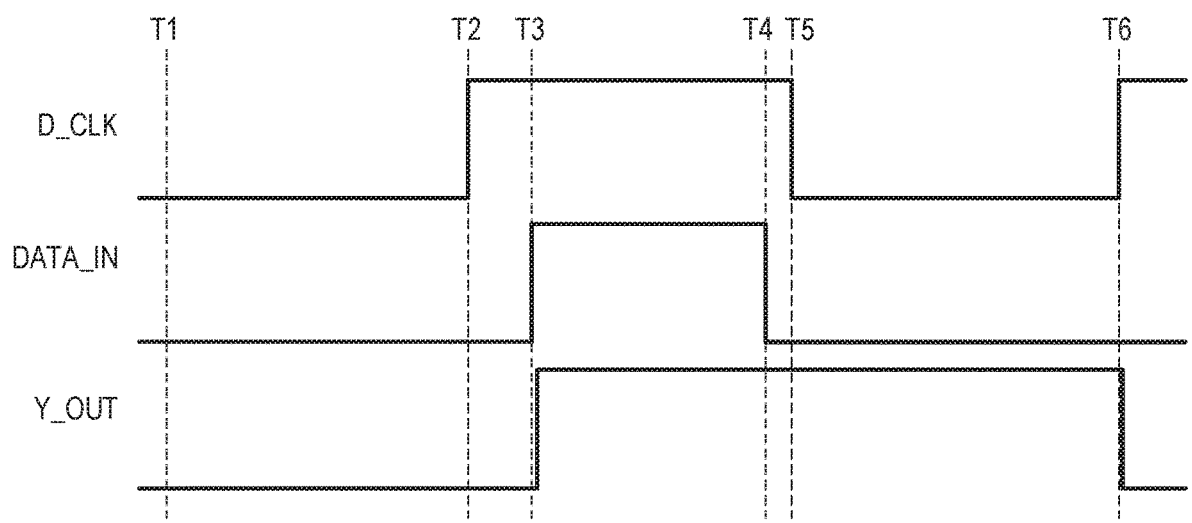

The waveform of the data input signal DATA_IN of FIG. 7 differs from the waveform of the data input signal DATA_IN of FIG. 4 in that the transition of the data input signal DATA_IN from logically low to logically high (e.g., a rising edge) occurs after, rather than before, the transition of the clock input signal D_CLK from logically low to logically high at time T3 in FIG. 4, and in that the transition of the data input signal DATA_IN from logically high to logically low (e.g., a falling edge) occurs before, rather than after, the transition of the clock input signal D_CLK from logically high to logically low at time T4 in FIG. 4. The operations and states of times T1, T2, T3 of FIG. 6 are the same as the operations and states of times T1, T2, T3 of FIG. 7, and the operations and states of times T4, T5, T6 of FIG. 5 are the same as the operations and states of times T4, T5, T6 of FIG. 7.

The pulsed flip-flop 300 of FIG. 3 can be implemented at a boundary between different voltage domains. For example, the clock input signal D_CLK, the data input signal DATA_IN, and the flip-flop output signal Y_OUT can be in different voltage domains. In other examples, any two or more of the clock input signal D_CLK, the data input signal DATA_IN, and the flip-flop output signal Y_OUT can be in a same voltage domain.

The master circuit 302 can level shift the data input signal DATA_IN to the voltage domain of the clock input signal D_CLK. The clock input signal D_CLK and the voltage of the clock voltage domain positive power supply node PSUP_CLK are in a same voltage domain. The data input signal DATA_IN is input to the master circuit 302, and the complementary internal signal Q_INTB and internal signal Q_INT are output from the master circuit 302, which are in the voltage domain of the clock input signal D_CLK and the voltage of the clock voltage domain positive power supply node PSUP_CLK. The master circuit 302 can be contention free. No p-type transistor having the data input signal DATA_IN provided on a gate is implemented in the master circuit 302. If a p-type transistor having the data input signal DATA_IN provided on its gate is implemented, the gate-to-source voltage $V_{GS}$ might not reach 0 V when the data input signal DATA_IN is logically high (e.g., such as when the voltage of the voltage domain of the clock voltage domain positive power supply node PSUP_CLK is greater than the voltage domain of the data input signal DATA_IN). The gate-to-source voltage $V_{GS}$ not reaching 0 V could permit the p-type transistor to not be open and could permit significant leakage current. In the master circuit 302, each of the p-type transistors M01, M04, M06, M07 have an input signal that is in the voltage domain of the data input signal DATA_IN and the voltage of the clock voltage domain positive power supply node PSUP_CLK. This permits the gate-to-source voltages $V_{GS}$ to reach 0 V under appropriate circumstances, which allows those p-type transistors M01, M04, M06, M07 to be open with reduced or no leakage current. The reduced or no leakage can improve writability of the master circuit 302.

The slave circuit 304 can level shift the complementary internal signal Q_INTB and internal signal Q_INT to the voltage domain of the slave complementary output signal Q_OUTB and the voltage of the output voltage domain positive power supply node PSUP_QOUT. The complementary internal signal Q_INTB and internal signal Q_INT are input to the slave circuit 304, and the slave complementary output signal Q_OUTB is output from the slave circuit 304.

FIGS. 8 through 11 illustrate waveforms of signals of the pulsed flip-flop 300 of FIG. 3 based on simulations of signals in various voltage domains.

Figure 8:
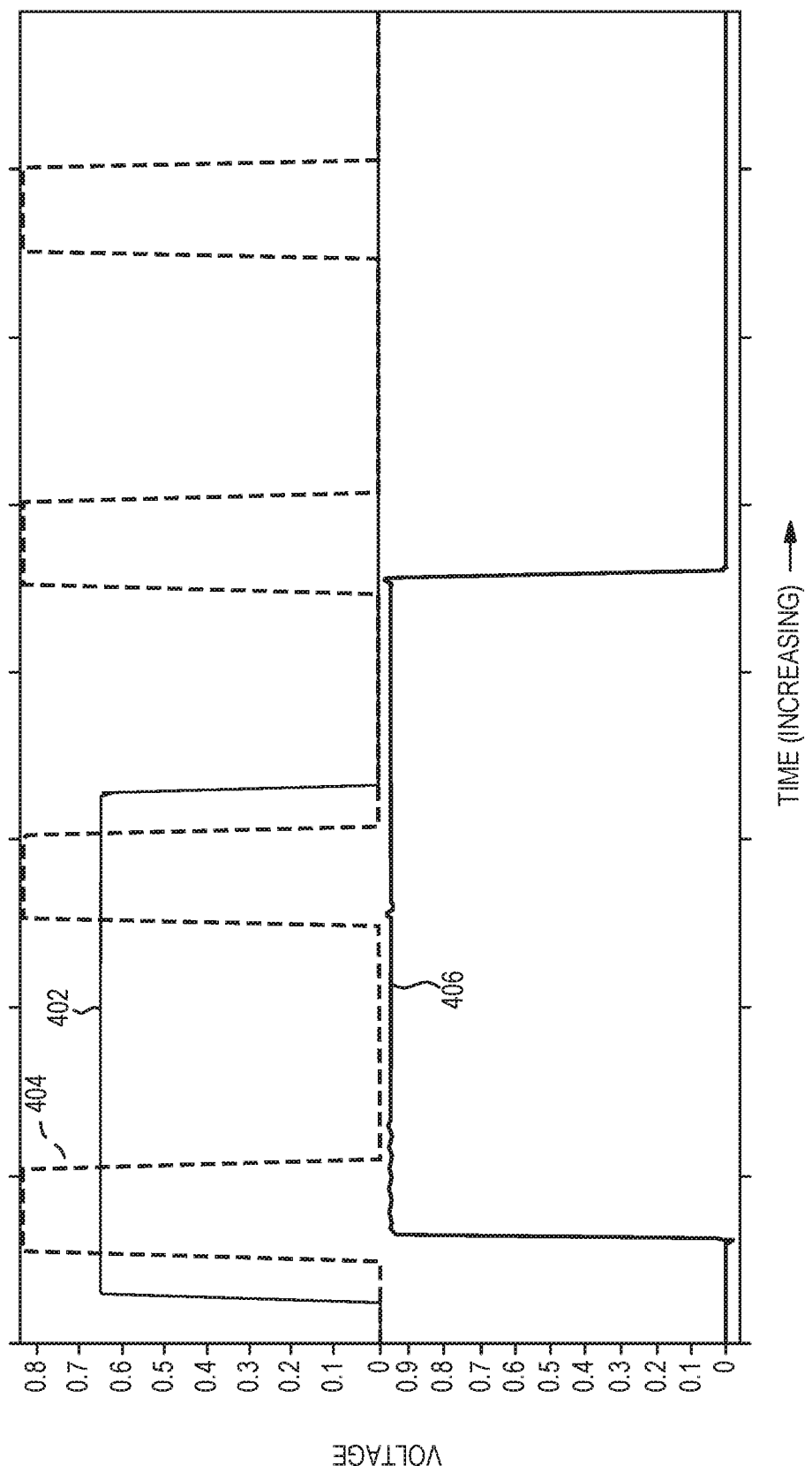
FIGS. 8 through 11 illustrate waveforms of signals of the pulsed flip-flop of FIG. 3 based on simulations of signals in various voltage domains.

FIG. 8 illustrates respective waveforms for a data input signal 402, a clock input signal 404, and a flip-flop output signal 406 in an operation of the pulsed flip-flop 300 of FIG. 3. The data input signal 402 is on the data input node DATA_IN and is in a voltage domain with a range from 0 V to 0.65 V. Hence, a logical high value of the data input signal 402 is approximately 0.65 V. The clock input signal 404 is on the clock input node D_CLK and is in a voltage domain with a range from 0 V to 0.83 V. Hence, a logical high value of the clock input signal 404 is approximately 0.83 V. The flip-flop output signal 406 is on the flip-flop output node Y_OUT and is in a voltage domain with a range from 0 V to 0.95 V. Hence, a logical high value of the flip-flop output signal 406 is approximately 0.95 V. FIG. 8 shows that a rising edge of the flip-flop output signal 406 follows a rising edge of the clock input signal 404 after the data input signal 402 transitions to (and remains at) a logical high, and that a falling edge of the flip-flop output signal 406 follows a rising edge of the clock input signal 404 after the data input signal 402 transitions to a logical low.

Figure 9:
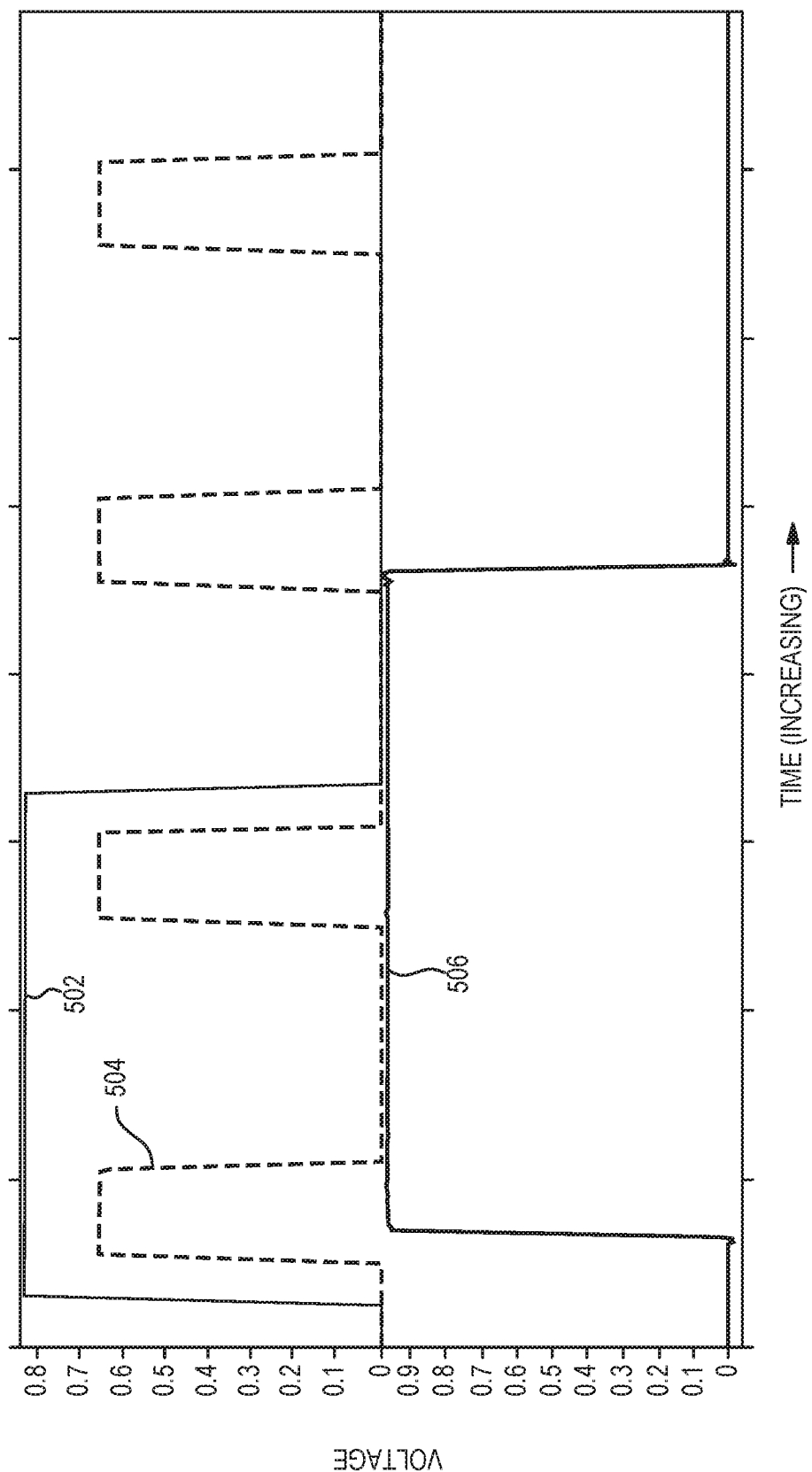

FIG. 9 illustrates respective waveforms for a data input signal 502, a clock input signal 504, and a flip-flop output signal 506 in an operation of the pulsed flip-flop 300 of FIG. 3. The data input signal 502 is on the data input node DATA_IN and is in a voltage domain with a range from 0 V to 0.83 V. Hence, a logical high value of the data input signal 502 is approximately 0.83 V. The clock input signal 504 is on the clock input node D_CLK and is in a voltage domain with a range from 0 V to 0.65 V. Hence, a logical high value of the clock input signal 504 is approximately 0.65 V. The flip-flop output signal 506 is on the flip-flop output node Y_OUT and is in a voltage domain with a range from 0 V to 0.95 V. Hence, a logical high value of the flip-flop output signal 506 is approximately 0.95 V. FIG. 9 shows that a rising edge of the flip-flop output signal 506 follows a rising edge of the clock input signal 504 after the data input signal 502 transitions to (and remains at) a logical high, and that a falling edge of the flip-flop output signal 506 follows a rising edge of the clock input signal 504 after the data input signal 502 transitions to a logical low.

Figure 10:
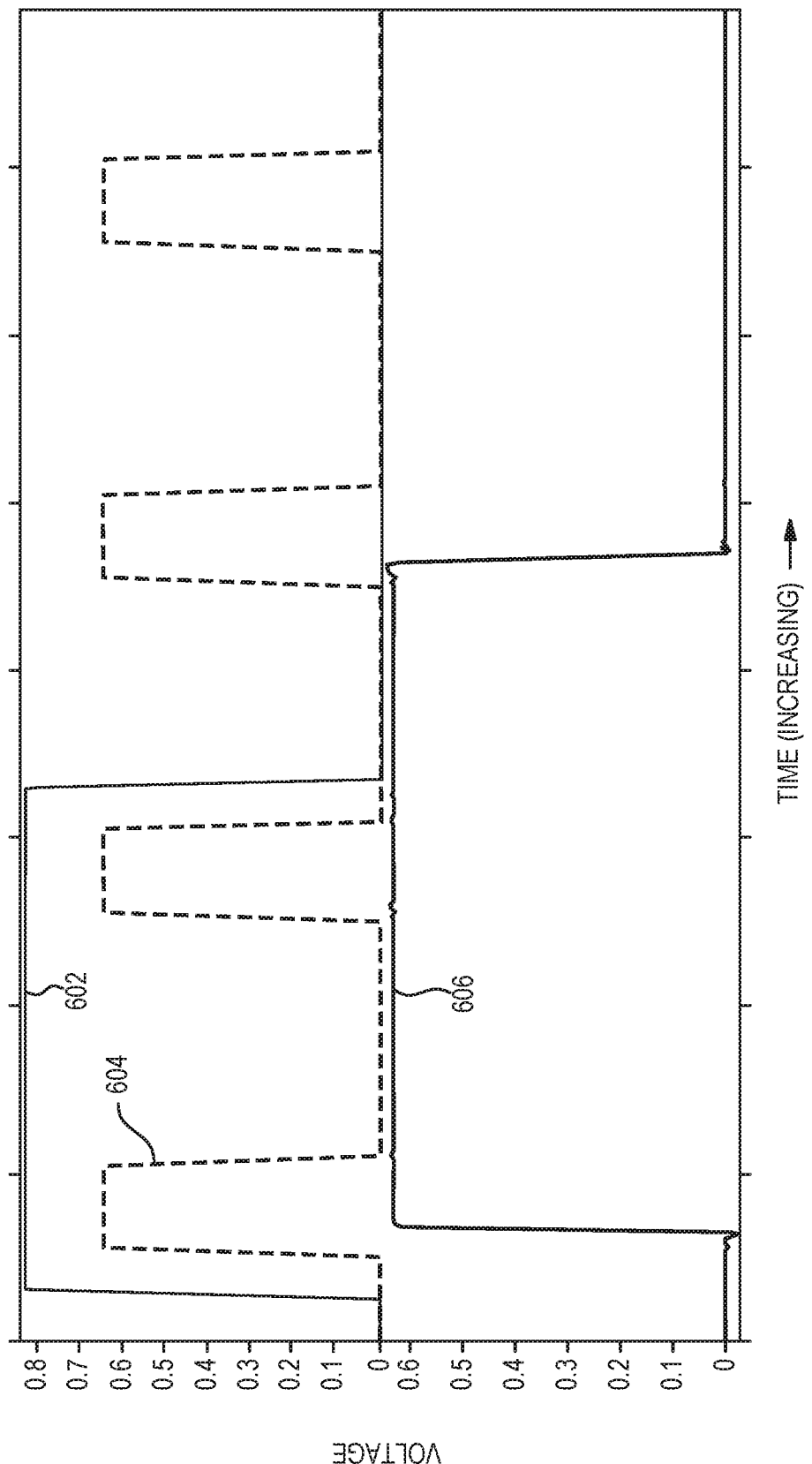

FIG. 10 illustrates respective waveforms for a data input signal 602, a clock input signal 604, and a flip-flop output signal 606 in an operation of the pulsed flip-flop 300 of FIG. 3. The data input signal 602 is on the data input node DATA_IN and is in a voltage domain with a range from 0 V to 0.83 V. Hence, a logical high value of the data input signal 602 is approximately 0.83 V. The clock input signal 604 is on the clock input node D_CLK and is in a voltage domain with a range from 0 V to 0.65 V. Hence, a logical high value of the clock input signal 604 is approximately 0.65 V. The flip-flop output signal 606 is on the flip-flop output node Y_OUT and is in a voltage domain with a range from 0 V to 0.65 V. Hence, a logical high value of the flip-flop output signal 606 is approximately 0.65 V. FIG. 10 shows that a rising edge of the flip-flop output signal 606 follows a rising edge of the clock input signal 604 after the data input signal 602 transitions to (and remains at) a logical high, and that a falling edge of the flip-flop output signal 606 follows a rising edge of the clock input signal 604 after the data input signal 602 transitions to a logical low.

Figure 11:
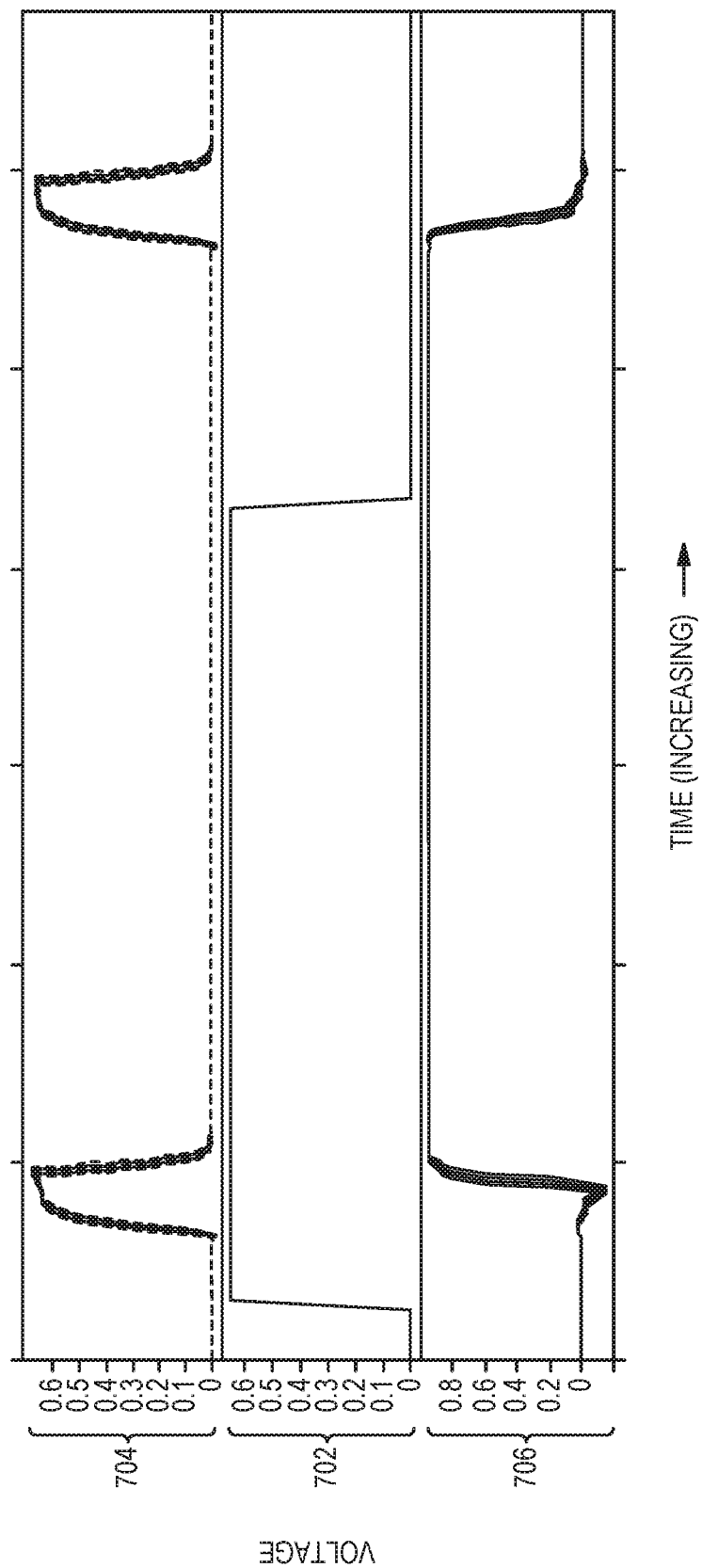

FIG. 11 illustrates respective waveforms for a group of data input signals 702, a group of clock input signals 704, and a group of flip-flop output signals 706 for a number of samples simulated for an operation of the pulsed flip-flop 300 of FIG. 3. In the illustrated graph, 4000 Monte Carlo simulations were performed to obtain the results shown by the graph. The data input signals 702 are on the data input node DATA_IN and are in a voltage domain with a range from 0 V to 0.65 V. Hence, a logical high value of the data input signals 702 is approximately 0.65 V. The clock input signals 704 are on the clock input node D_CLK and are in a voltage domain with a range from 0 V to 0.65 V. Hence, a logical high value of the clock input signals 704 is approximately 0.65 V. The flip-flop output signals 706 are on the flip-flop output node Y_OUT and are in a voltage domain with a range from 0 V to 0.95 V. Hence, a logical high value of the flip-flop output signals 706 is approximately 0.95 V. FIG. 11 shows little variation between the various signals between different iterations of the samples. The signals also are shown to follow the pattern of FIGS. 8 through 10.

In some implementations of the pulsed flip-flop 300, delay can be reduced across different process, voltage, and temperature (PVT) corners. Different scenarios were simulated to measure the delay from a rising edge of a clock signal to a rising edge of a flip-flop output signal (e.g., where the data input signal is logically high at the rising edge of the clock signal). The measurement threshold that was used was 50% if the clock signal to 50% of the flip-flop output signal. Table 1 below shows the results of the simulations, which were significant improvements over previous circuits. As shown by Table 1, the pulsed flip-flop 300 can be highly robust across PVT.

TABLE 1

| Value | Process | $V_{CLK}$ | $V_{DATA\_IN}$ | $V_{Y\_OUT}$ | Temperature | Delay |
|---|---|---|---|---|---|---|
| Typical | TTTTG | 0.83 V | 0.83 V | 0.83 V | 25° C. | 34.8 ps |
| Worst | SSSSG | 0.65 V | 0.95 V | 0.65 V | −40° C. | 65.8 ps |
| Best | FFFFG | 0.95 V | 0.95 V | 0.95 V | −40° C. | 24.7 ps |

Additionally, the setup time can be reduced, and the hold time can be programmable for a desired hold time. In an example implementation of the pulsed flip-flop 300, the setup time was shown to be 0 ps for the typical case shown above in Table 1, while the hold time was 110 ps when the clock signal had a pulse width of 110 ps. In some examples (e.g., particularly in which the pulsed flip-flop is implemented in programmable devices), the clock signal can have a pulse width (and hence, duty cycle) that is programmable, and hence, the hold time of the pulsed flip-flop 300 can be programmable as a result of the programmability of the clock signal.

Further, the pulsed flip-flop 300 can be implemented in a smaller area of an IC relative to other solutions. The pulsed flip-flop 300 can have fewer transistors, which can result in less area of the IC being consumed by the pulsed flip-flop 300.

Figure 12:
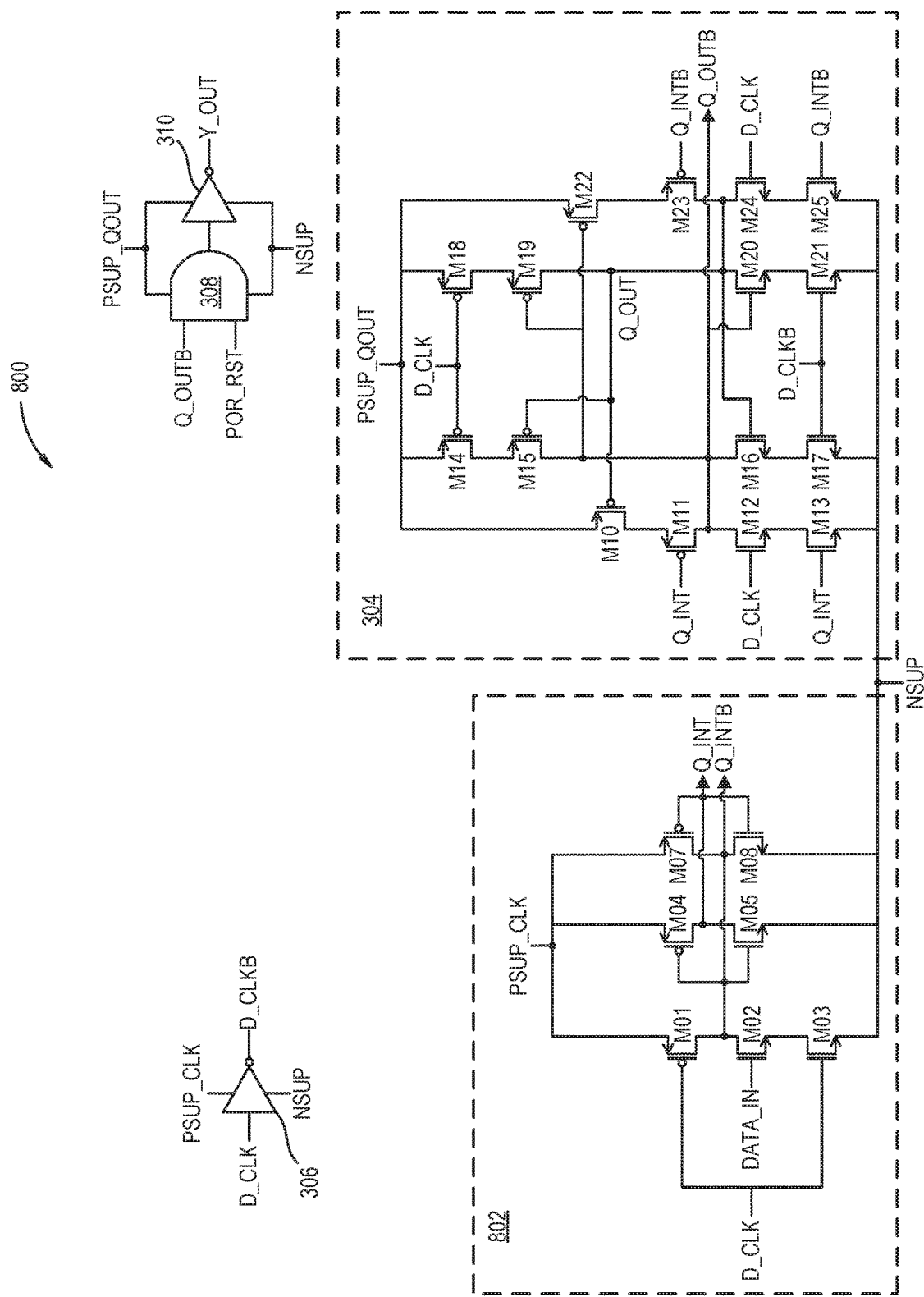
FIG. 12 is a circuit schematic of a pulsed flip-flop according to some examples.

FIG. 12 is a circuit schematic of a pulsed flip-flop 800 according to some examples. The pulsed flip-flop 800 can be implemented in any of the Z-interfaces 232-238 of FIG. 2, for example. In other examples, the pulsed flip-flop 800 can be implemented in any IC. The pulsed flip-flop 800 can be implemented in any instance where a signal is to cross voltage domains. The pulsed flip-flop 800 of FIG. 12 is the same as the pulsed flip-flop 300 of FIG. 3, except the master circuit 802 does not include the p-type transistor M06 and n-type transistor M09 connecting the inverter of the latch of the master circuit 802 (e.g., that has the complementary internal node Q_INTB as an output node) to the clock voltage domain positive power supply node PSUP_CLK and the common negative power supply node NSUP. The source of the p-type transistor M07 is connected to the clock voltage domain positive power supply node PSUP_CLK. The source of the n-type transistor M08 is connected to the common negative power supply node NSUP. The pulsed flip-flop 800 of FIG. 12 can operate and have features and benefits as described above with respect to the pulsed flip-flop 300 of FIG. 3.

Figure 13:
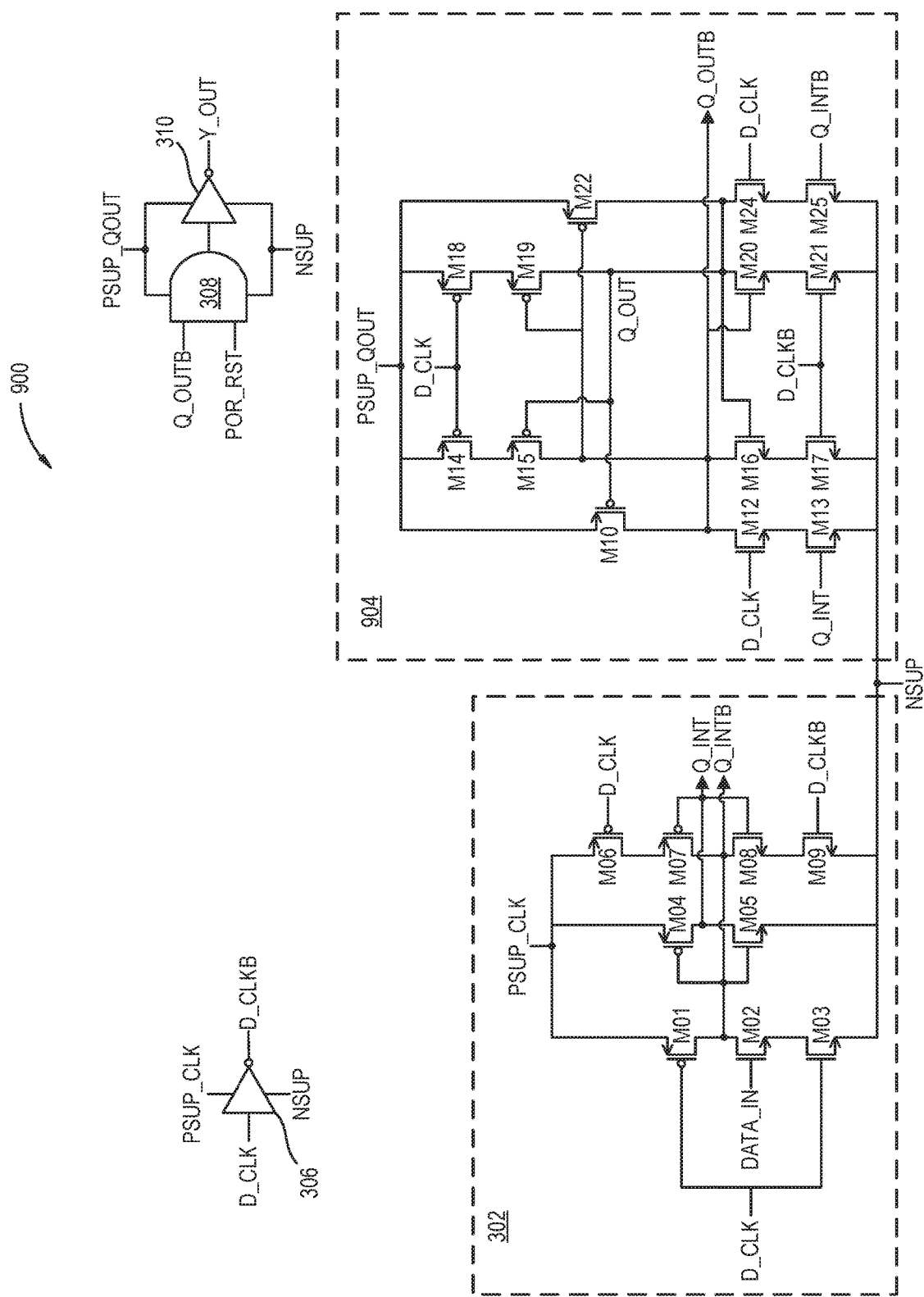
FIG. 13 is a circuit schematic of a pulsed flip-flop according to some examples.

FIG. 13 is a circuit schematic of a pulsed flip-flop 900 according to some examples. The pulsed flip-flop 900 can be implemented in any of the Z-interfaces 232-238 of FIG. 2, for example. In other examples, the pulsed flip-flop 900 can be implemented in any IC. The pulsed flip-flop 900 can be implemented in any instance where a signal is to cross voltage domains. The pulsed flip-flop 900 of FIG. 13 is the same as the pulsed flip-flop 300 of FIG. 3, except the slave circuit 904 does not include the p-type transistor M11 and p-type transistor M23 in the resolving circuit. The pulsed flip-flop 900 of FIG. 13 can operate and have features and benefits as described above with respect to the pulsed flip-flop 300 of FIG. 3.

The respective drains of the p-type transistor M10 and n-type transistor M12 are connected together at the slave complementary output node Q_OUTB, which are further connected to the drains of the p-type transistor M15 and n-type transistor M16 and to the respective gates of the p-type transistors M19, M22 and n-type transistor M20. The respective drains of the p-type transistor M22 and n-type transistor M24 are connected together at the slave output node Q_OUT, which are further connected to the drains of the p-type transistor M19 and n-type transistor M20 and to the respective gates of the p-type transistors M10, M15 and n-type transistor M16.

Figure 14:
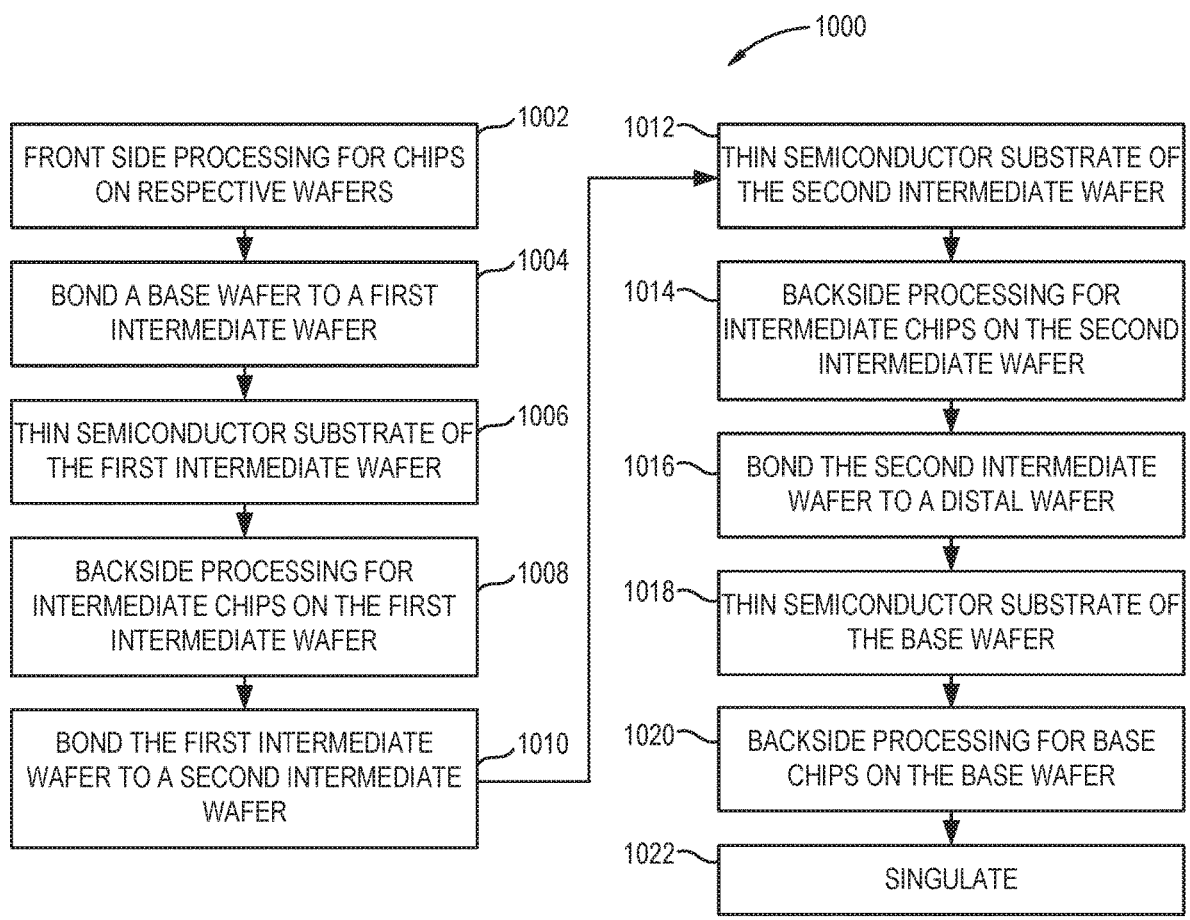
FIG. 14 is a flowchart of a method of forming the multi-chip device of FIG. 1 according to some examples.

FIG. 14 is a flowchart of a method 1000 of forming the multi-chip device of FIG. 1 according to some examples. A person having ordinary skill in the art will readily understand modifications to achieve other multi-chip devices. The processing of the method 1000 of FIG. 14 is generally described, and a person having ordinary skill in the art will readily understand the more specific processing that can be performed. The more specific processing can be according to any semiconductor processing for forming an IC on substrate, which is to be singulated into a chip. For ease of description herein, a wafer on which one or more base chips 102 are formed is referred to as a base wafer; a wafer on which one or more intermediate chips 104, 106 are formed is referred to as an intermediate wafer; and a wafer on which one or more distal chips 108 are formed is referred to as a distal wafer. Any wafer can be any shape and/or size.

At block 1002, front side processing for chips on the respective wafers is performed. For example, front side processing of each semiconductor substrate 112, 114, 116, 118 (e.g., wafer) can include forming devices (e.g., transistors 142, 144, 146, 148) in and/or on the front surface of the semiconductor substrate 112, 114, 116, 118, and forming front side dielectric layer(s) 122, 124, 126, 128 with metallizations and front side bond pads 152, 154, 156, 158 on the front surface of the semiconductor substrate 112, 114, 116, 118. Multiple base chips 102 can be formed on a base wafer. Multiple intermediate chips 104, 106 can be formed on each of a plurality of intermediate wafers. Multiple distal chips 108 can be formed on a distal wafer.

At block 1004, a base wafer is bonded to a first intermediate wafer, such as front side to front side bonding as shown in FIG. 1. As a result of the bonding, a front side of a base chip 102 is bonded to a front side of an intermediate chip 104, as shown in FIG. 1. The bonding can be hybrid bonding, such as bonding front side bond pads 152 on the base wafer to front side bond pads 154 on the first intermediate wafer, and bonding the exterior surface of the front side dielectric layer(s) 122 on the base wafer to the exterior surface of the front side dielectric layer(s) 124 on the first intermediate wafer.

At block 1006, the semiconductor substrate of the first intermediate wafer is thinned from a backside of the first intermediate wafer. As show in FIG. 1, the semiconductor substrate 114 of the intermediate chip 104 is thinned from the backside. The thinning can be by a chemical mechanical polish (CMP) or other appropriate process. At block 1008, backside processing for intermediate chips on the first intermediate wafer is performed. As illustrated by FIG. 1, the backside processing can include forming backside TSVs 164 through the semiconductor substrate 114 of the first intermediate wafer and connecting to metallization in the front side dielectric layer(s) 124 on the first intermediate wafer. The backside processing can further include forming backside dielectric layer(s) 134 with metallizations and backside bond pads 174 on the backside of the semiconductor substrate 114. The metallizations in the backside dielectric layer(s) 134 can be connected to the metallizations in the front side dielectric layer(s) 124 through the backside TSVs 164.

At block 1010, the first intermediate wafer is bonded to a second intermediate wafer, such as backside to front side bonding as shown in FIG. 1. As a result of the bonding, a backside of an intermediate chip 104 is bonded to a front side of an intermediate chip 106, as shown in FIG. 1. The bonding can be hybrid bonding, such as bonding backside bond pads 174 on the first intermediate wafer to front side bond pads 156 on the second intermediate wafer, and bonding the exterior surface of the backside dielectric layer(s) 134 on the first intermediate wafer to the exterior surface of the front side dielectric layer(s) 126 on the second intermediate wafer.

At block 1012, the semiconductor substrate of the second intermediate wafer is thinned from a backside of the second intermediate wafer, like described with respect to block 1006. As show in FIG. 1, the semiconductor substrate 116 of the intermediate chip 106 is thinned from the backside.

At block 1014, backside processing for intermediate chips on the second intermediate wafer is performed, like described with respect to block 1008. As illustrated by FIG. 1, the backside processing can include forming backside TSVs 166 through the semiconductor substrate 116 of the second intermediate wafer and connecting to metallization in the front side dielectric layer(s) 126 on the second intermediate wafer. The backside processing can further include forming backside dielectric layer(s) 136 with metallizations and backside bond pads 176 on the backside of the semiconductor substrate 116. The metallizations in the backside dielectric layer(s) 136 can be connected to the metallizations in the front side dielectric layer(s) 126 through the backside TSVs 166.

At block 1016, the second intermediate wafer is bonded to a distal wafer, such as backside to front side bonding as shown in FIG. 1. As a result of the bonding, a backside of an intermediate chip 106 is bonded to a front side of a distal chip 108, as shown in FIG. 1. The bonding can be hybrid bonding, such as bonding backside bond pads 176 on the second intermediate wafer to front side bond pads 158 on the distal wafer, and bonding the exterior surface of the backside dielectric layer(s) 136 on the second intermediate wafer to the exterior surface of the front side dielectric layer(s) 128 on the distal wafer.

At block 1018, the semiconductor substrate of the base wafer is thinned from a backside of the base wafer, like described with respect to block 1006. As show in FIG. 1, the semiconductor substrate 112 of the base chip 102 is thinned from the backside.

At block 1020, backside processing for base chips on the base wafer is performed, like described with respect to block 1008. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallizations and exterior connector backside pads 172 on the backside of the semiconductor substrate 112. The metallizations in the backside dielectric layer(s) 132 can be connected to the metallizations in the front side dielectric layer(s) 122 through the backside TSVs 162. The backside processing for the base chips 102 can further include forming the passivation layer 180 and external connectors 182. At block 1022, the bonded wafers are singulated (e.g., by sawing) to separate individual multi-chip devices that have been formed. Each of the multi-chip devices can be as shown in FIG. 1.

The various operations of blocks of the method 1000 can be repeated and/or omitted to form various multi-chip devices. The method 1000 has been provided as an example of how some multi-chip devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-chip devices. A person having ordinary skill in the art will readily understand how to form other multi-chip devices based on the description of the method 1000 above.

Figure 15:
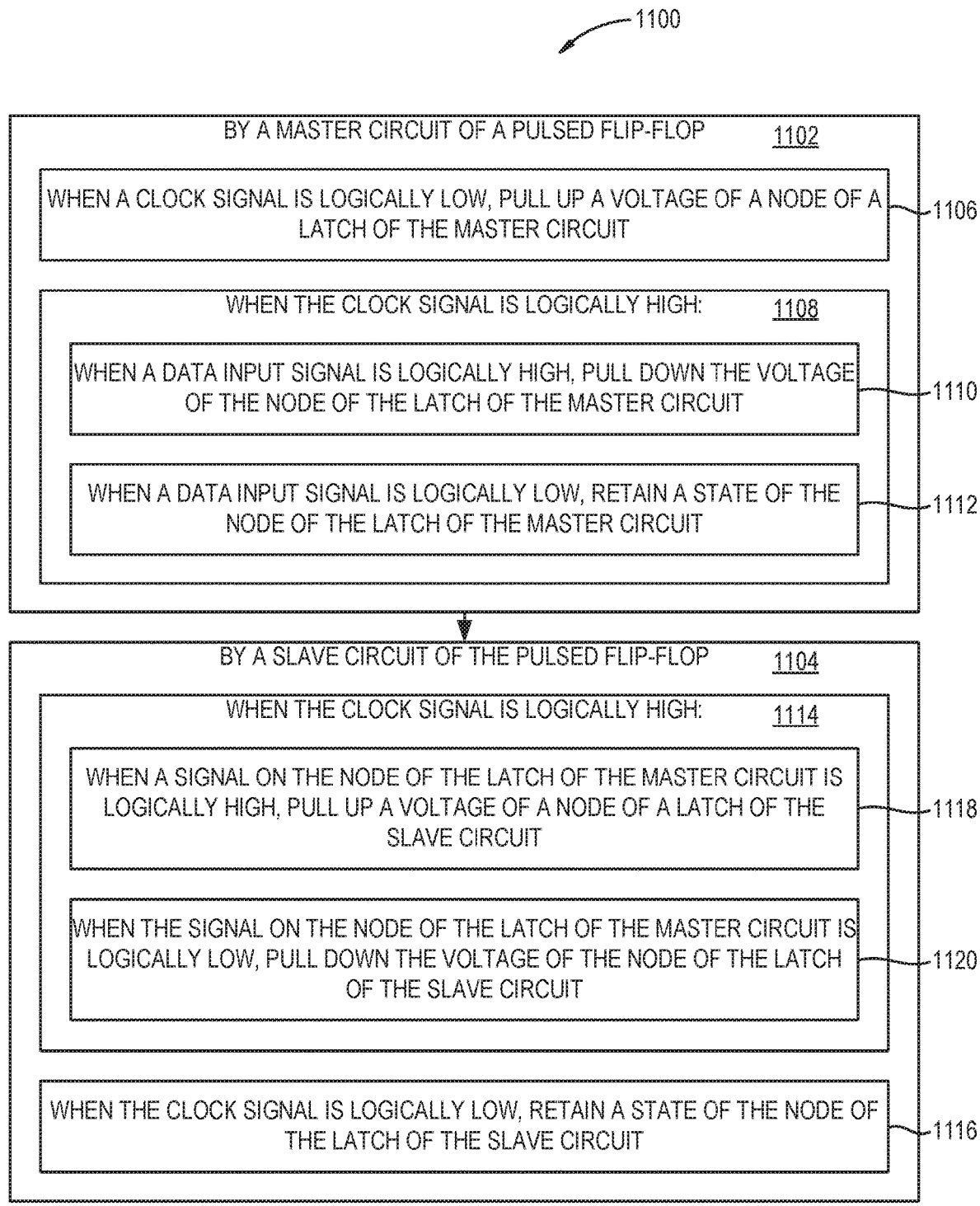
FIG. 15 is a flowchart of a method of operating a device according to some examples.

FIG. 15 is a flowchart of a method 1100 of operating a device according to some examples. The device includes a pulsed flip-flop, such as any of the pulsed flip-flops 300, 800, 900 of FIGS. 3, 12, and 13. The method 1100 is described in the context of the pulsed flip-flop 300 as an example. Additionally, the method 1100 is described in the context of various states of signals on nodes in the pulsed flip-flop 300 as an example. A person having ordinary skill in the art will readily understand that the circuit can vary as well as states of various signals while performing operations within the scope of some examples.

The method 1100 includes various operations at various blocks. No state or sequence of operations of blocks is implied at the master circuit and at the slave circuit of the pulsed flip-flop, except that a state of the master circuit can cause or effect a state of the slave circuit.

Block 1102 indicates operations performed by a master circuit of the pulsed flip-flop. Block 1104 indicates operations performed by a slave circuit of the pulsed flip-flop.

Block 1106 indicates an operation performed by the master circuit when a clock signal is logically low, and block 1108 indicates operations at blocks 1110, 1112 performed by the master circuit when the clock signal is logically high.

At block 1106, when the clock signal is logically low, a voltage of a node of a latch of the master circuit is pulled up. Referring to FIG. 3, when the clock input signal D_CLK on the clock input node D_CLK is logically low, the pre-charge input circuit pulls up a voltage of the complementary internal node Q_INTB. When the clock input signal D_CLK is logically low, the p-type transistor M01 is closed, and the n-type transistor M03 is open, which pulls up the voltage of the complementary internal node Q_INTB to logically high. Further, the latch of the master circuit causes the voltage of the internal node Q_INT to be pulled down to logically low.

At block 1110, when the clock and a data input signal are logically high, the voltage of the node of the latch of the master circuit is pulled down. Referring to FIG. 3, when the clock input signal D_CLK is logically high, the p-type transistor M01 is open, and the n-type transistor M03 is closed. Further, when the data input signal DATA_IN is logically high, the n-type transistor M02 is closed. While the n-type transistors M02, M03 are closed and the p-type transistor M01 is open, the voltage on the complementary internal node Q_INTB is pulled down to logically low. Further, the latch of the master circuit causes the voltage of the internal node Q_INT to be pulled up to logically high.

At block 1112, when the clock signal is logically high and the data input signal is logically low, a state of the node of the latch of the master circuit is retained. Referring to FIG. 3, when the clock input signal D_CLK is logically high, the p-type transistor M01 is open, and the n-type transistor M03 is closed. Further, when the data input signal DATA_IN is logically low, the n-type transistor M02 is open. While the p-type transistor M01 and the n-type transistor M02 are open, the latch of the master circuit retains its state such that the complementary internal signal Q_INTB on the complementary internal node Q_INTB and the internal signal Q_INT on the internal node Q_INT retain their respective states.

Block 1114 indicates operations at blocks 1118, 1120 performed by the slave circuit when the clock signal is logically high. Additionally, when the clock signal is logically high, a latch of the slave circuit is de-coupled from a positive power supply node and a negative power supply node, between which the latch is connected. Referring to FIG. 3, when the clock input signal D_CLK is logically high, the p-type transistors M14, M18 and n-type transistors M17, M21 are open, which de-couples the latch of the slave circuit from the output voltage domain positive power supply node PSUP_QOUT and the common negative power supply node NSUP.

Block 1116 indicates an operation performed by the slave circuit when the clock signal is logically low. At block 1116, when the clock signal is logically low, a state of the node of the latch of the slave circuit is retained. Additionally, when the clock signal is logically low, the latch of the slave circuit is coupled to a positive power supply node and a negative power supply node, between which the latch is connected. Referring to FIG. 3, when the clock input signal D_CLK is logically low, the p-type transistors M14, M18 and n-type transistors M17, M21 are closed, which couples the latch of the slave circuit to the output voltage domain positive power supply node PSUP_QOUT and the common negative power supply node NSUP. Further, referring to FIG. 3, when the clock input signal D_CLK is logically low, the n-type transistors M12, M24 will be open, e.g., if either of the n-type transistors M13, M25 become closed, which disables the resolving circuit and prevents respective voltages on the slave complementary output node Q_OUTB and slave output node Q_OUT from being pulled up or down except by the latch of the slave circuit.

At block 1118, when the clock signal and a signal on the node of the latch of the master circuit are logically high, a voltage of a node of the latch of the slave circuit is pulled up. Referring to FIG. 3, when the clock input signal D_CLK and the complementary internal signal Q_INTB on the complementary internal node Q_INTB are logically high (and the internal signal Q_INT on the internal node Q_INT is logically low), the n-type transistors M24, M25 are closed, which pulls down a voltage of the slave output node Q_OUT to logically low. The slave output node Q_OUT being logically low causes p-type transistor M10 to close, and the internal signal Q_INT being logically low causes the p-type transistor M11 to close and the n-type transistor M13 to be open. The p-type transistors M10, M11 being closed pulls up a voltage of the slave complementary output node Q_OUTB to logically high.

At block 1120, when the clock signal is logically high and the signal on the node of the latch of the master circuit is logically low, the voltage of the node of the latch of the slave circuit is pulled down. Referring to FIG. 3, when the clock input signal D_CLK is logically high and the complementary internal signal Q_INTB on the complementary internal node Q_INTB is logically low (and the internal signal Q_INT on the internal node Q_INT is logically high), the n-type transistors M12, M13 are closed, which pulls down a voltage of the slave complementary output node Q_OUTB to logically low. The slave complementary output node Q_OUTB being logically low causes p-type transistor M22 to close, and the complementary internal signal Q_INTB being logically low causes the p-type transistor M23 to close and the n-type transistor M25 to be open. The p-type transistors M22, M23 being closed pulls up a voltage of the slave output node Q_OUT to logically high.

While the foregoing is directed to specific examples, other and further examples may be devised without departing from the basic scope thereof, and the scope thereof is determined by the claims that follow.

What is claimed is:

1. A device comprising:
   a pulsed flip-flop comprising:
      a master circuit comprising a pre-charge input circuit and a first latch, a first node being connected between the pre-charge input circuit and the first latch, wherein the master circuit is configured to:
         pull up a voltage of the first node when a clock signal to the pulsed flip-flop is in a first state;
         pull down the voltage of the first node when the clock signal is in a second state complementary to the first state and a data input signal to the master circuit is in a third state; and
         retain a state of the first node when the clock signal is in the second state and the data input signal is in a fourth state complementary to the third state; and
      a slave circuit sequentially connected to the master circuit, the slave circuit comprising a resolving circuit and a second latch, the first node being connected to an input node of the resolving circuit, a second node being connected between the resolving circuit and the second latch, the slave circuit being configured to:
         pull up a voltage of the second node when the clock signal is in the second state and a signal on the first node is in a fifth state;

pull down the voltage of the second node when the clock signal is in the second state and the signal on the first node is in a sixth state complementary to the fifth state; and retain a state of the second node when the clock signal is in the first state.

2. The device of claim 1, wherein:
the pre-charge input circuit has a clock input node and a data input node;
each of the pre-charge input circuit and the first latch is connected between a first positive power supply node and a common negative power supply node; and
each of the resolving circuit and the second latch is connected between a second positive power supply node and the common negative power supply node.

3. The device of claim 2, wherein:
the data input node is configured in a first voltage domain;
the clock input node and the first positive power supply node are configured in a second voltage domain; and
the second positive power supply node is configured in a third voltage domain different from the first voltage domain.

4. The device of claim 3, wherein the second voltage domain is different from the first voltage domain and the third voltage domain.

5. The device of claim 2, wherein the pre-charge input circuit is configured to:
pull up a voltage of the first node to a voltage of the first positive power supply node when the clock signal on the clock input node is logically low;
pull down the voltage of the first node to a voltage of the common negative power supply node when the clock signal on the clock input node is logically high and the data input signal on the data input node is logically high; and
de-couple the first node from the first positive power supply node and the common negative power supply node through the pre-charge input circuit when the clock signal on the clock input node is logically high and the data input signal on the data input node is logically low.

6. The device of claim 2, wherein the pre-charge input circuit comprises:
a p-type transistor having a source connected to the first positive power supply node, a drain connected to the first node, and a gate connected to the clock input node; and
a first n-type transistor and a second n-type transistor serially connected between the first node and the common negative power supply node, the first n-type transistor having a gate connected to the clock input node, the second n-type transistor having a gate connected to the data input node.

7. The device of claim 2, wherein the resolving circuit is configured to selectively:
pull up the voltage of the second node to a voltage of the second positive power supply node when the clock signal on the clock input node is logically high and the signal on the first node is logically high;
pull down the voltage of the second node to a voltage of the common negative power supply node when the clock signal on the clock input node is logically high and the signal on the first node is logically low; and
be disabled when the clock signal on the clock input node is logically low.

8. The device of claim 2, wherein:
the first latch has a third node complementary of the first node;
the second latch has a fourth node complementary of the second node; and
the resolving circuit comprises:
a first p-type transistor connected between the second positive power supply node and the second node, and having a gate connected to the fourth node; and
a first n-type transistor and a second n-type transistor serially connected between the second node and the common negative power supply node, the first n-type transistor having a gate connected to the clock input node, the second n-type transistor having a gate connected to the third node;
a second p-type transistor connected between the second positive power supply node and the fourth node, and having a gate connected to the second node; and
a third n-type transistor and a fourth n-type transistor serially connected between the fourth node and the common negative power supply node, the third n-type transistor having a gate connected to the clock input node, the fourth n-type transistor having a gate connected to the first node.

9. The device of claim 2, wherein the slave circuit is configured to:
de-couple the second latch from between the second positive power supply node and the common negative power supply node when the resolving circuit is pulling up or pulling down the voltage of the second node; and
couple the second latch to the second positive power supply node and the common negative power supply node when the resolving circuit is disabled.

10. The device of claim 2, wherein the slave circuit comprises:
one or more p-type transistors connected between the second positive power supply node and the second latch, the one or more p-type transistors each having a respective gate connected to the clock input node; and
one or more n-type transistors connected between the second latch and the common negative power supply node, the one or more n-type transistors each having a respective gate connected to a complementary clock input node that is complementary to the clock input node.

11. The device of claim 1 further comprising a chip stack comprising multiple chips, neighboring ones of the multiple chips being attached to each other, the pulsed flip-flop being disposed on a chip of the multiple chips.

12. A method of operating a device, the method comprising:
by a master circuit of a pulsed flip-flop:
pulling up a voltage of a first node of a first latch of the master circuit when a clock signal to the pulsed flip-flop is in a first state;
pulling down the voltage of the first node of the first latch when the clock signal is in a second state complementary to the first state and a data input signal to the master circuit is in a third state; and
retaining a state of the first node of the first latch when the clock signal is in the second state and the data input signal is in a fourth state complementary to the third state; and
by a slave circuit of the pulsed flip-flop:
pulling up a voltage of a second node of a second latch of the slave circuit when the clock signal is in the second state and a signal on the first node is in a fifth state;

pulling down the voltage of the second node of the second latch when the clock signal is in the second state and the signal on the first node is in a sixth state complementary to the fifth state; and retaining a state of the second node of the second latch when the clock signal is in the first state.

13. The method of claim 12, wherein:

the first latch is connected between a first positive power supply node and a common negative power supply node; and the second latch is connected between a second positive power supply node and the common negative power supply node.

14. The method of claim 13, wherein:

the data input signal is in a first voltage domain;

the clock signal and a voltage of the first positive power supply node are in a second voltage domain; and a voltage of the second positive power supply node is in a third voltage domain different from the first voltage domain.

15. The method of claim 14, wherein the second voltage domain is different from the first voltage domain and the third voltage domain.

16. The method of claim 12, wherein:

the first state is logically low;

the second state is logically high;

the third state is logically high;

the fourth state is logically low;

the fifth state is logically high; and the sixth state is logically low.

17. The method of claim 12 further comprising, by the slave circuit:

coupling the second latch to a positive power supply node and a negative power supply node when the clock signal is in the first state; and de-coupling the second latch from the positive power supply node and the negative power supply node when the clock signal is in the second state.

18. The method of claim 12, wherein the pulsed flip-flop is disposed on a chip of a chip stack, the chip stack comprising multiple chips, neighboring ones of the multiple chips being attached to each other.

19. A device comprising:

a first latching circuit for latching a state of a first node;

a pre-charging circuit for pulling up a voltage of the first node to a voltage of a first positive power supply node when a clock signal is in a first state, pulling down the voltage of the first node to a voltage of a common negative power supply node when the clock signal is in a second state complementary to the first state and a data input signal is in a third state, and de-coupling the first node from the first positive power supply node and the common negative power supply node through the pre-charging circuit based on a data input signal and a clock signal when the clock signal is in the second state and the data input signal is in a fourth state complementary to the third state;

a second latching circuit for latching a state of a second node; and a resolving circuit for pulling up a voltage of the second node to a voltage of a second positive power supply node when the clock signal is in the second state and a signal to the first node is in a fifth state, pulling down the voltage of the second node to the voltage of the common negative power supply node when the clock signal is in the second state and the signal to the first node is in a sixth state complementary to the fifth state, and being disabled based on the clock signal and the state of the first node of the first latching circuit when the clock signal is in the first state.

20. The device of claim 19, wherein:

the data input signal is in a first voltage domain;

the clock signal and the voltage of the first positive power supply node are in a second voltage domain;

the voltage of the second positive power supply node is in a third voltage domain; and the first voltage domain, the second voltage domain, and the third voltage domain are voltage domains different from each other.

* * * * *